United States Patent
Ohoka et al.

(10) Patent No.: US 10,076,068 B2
(45) Date of Patent: Sep. 11, 2018

(54) ELECTRIC POWER CONVERTOR

(71) Applicants: NIPPON SOKEN, INC., Nishio, Aichi-pref. (JP); DENSO CORPORATION, Kariya, Aichi-pref. (JP)

(72) Inventors: Shinji Ohoka, Okazaki (JP); Naohisa Harada, Aichi-ken (JP)

(73) Assignees: NIPPON SOKEN, INC., Nishio (JP); DENSO COPORATION, Kariya (JP)

( * ) Notice: Subject to any disclaimer, the term of this patent is extended or adjusted under 35 U.S.C. 154(b) by 75 days.

(21) Appl. No.: 14/593,193

(22) Filed: Jan. 9, 2015

(65) Prior Publication Data

US 2015/0195957 A1    Jul. 9, 2015

(30) Foreign Application Priority Data

Jan. 9, 2014  (JP) .................................. 2014-002061
Nov. 10, 2014  (JP) .................................. 2014-228145

(51) Int. Cl.
*H05H 7/20* (2006.01)
*H05K 7/20* (2006.01)
*H05K 7/14* (2006.01)

(52) U.S. Cl.
CPC ....... *H05K 7/20927* (2013.01); *H05K 7/1432* (2013.01)

(58) Field of Classification Search
CPC ............. H05K 7/20263; H05K 7/1432; H05K 7/20927; H01L 25/00; H01L 2924/1305;
(Continued)

(56) References Cited

U.S. PATENT DOCUMENTS 4,554,496 A * 11/1985 Rudich, Jr. .............. G05D 3/14
                                                       318/12
6,972,957 B2 * 12/2005 Beihoff .................. B60L 11/12
                                                      165/104.33
(Continued)

FOREIGN PATENT DOCUMENTS

JP        2001-308245        11/2001
JP        2005-073342         3/2005
(Continued)

OTHER PUBLICATIONS

Office Action (2 pgs.) dated Jan. 12, 2016 issued in corresponding Japanese Application No. 2014-228145 with an at least partial English language translation (2 pgs.).

*Primary Examiner* — Mukund G Patel
(74) *Attorney, Agent, or Firm* — Nixon & Vanderhye P.C.

(57) ABSTRACT

An electric power converter includes a semiconductor module, a cooler, and a pair of direct current bus bars. The direct current bus bars are connected to the semiconductor. The direct current bus bars serve as current paths between the direct current power supply and the switching element. The cooler is made of metal, and is electrically connected to ground. A proximal bypass capacitor is formed close to the switching element by a heat radiating plate integrated with the semiconductor module, the cooler, and an insulating layer interposed between them. The electric power converter further includes a pair of distal bypass capacitors, each of which has a larger capacitance than the proximal bypass capacitor has, and has a current path to the switching element of which a length is longer than a current path to the switching element from the proximal bypass capacitor.

4 Claims, 20 Drawing Sheets

(58) Field of Classification Search
CPC ... H01L 2924/13055; H01L 2924/1306; H01L 2924/13091; H02M 7/493; H02M 2001/007
See application file for complete search history.

(56) References Cited

U.S. PATENT DOCUMENTS

| | | | | |
|---|---|---|---|---|
| 7,016,192 | B2* | 3/2006 | Beihoff | B60L 11/12 257/714 |
| 7,508,668 | B2* | 3/2009 | Harada | H01L 25/072 361/689 |
| 7,542,318 | B2* | 6/2009 | Otsuka | H02M 7/003 363/178 |
| 7,952,856 | B2* | 5/2011 | Otsuka | B60K 6/405 180/65.275 |
| 8,384,239 | B2* | 2/2013 | Campbell | B60K 1/04 307/10.1 |
| 8,929,097 | B2* | 1/2015 | Nakasaka | H01L 23/473 361/688 |
| 9,137,932 | B2* | 9/2015 | Tokuyama | H01L 23/36 |
| 2006/0284308 | A1 | 12/2006 | Harada et al. | |
| 2008/0164607 | A1 | 7/2008 | Harada et al. | |
| 2009/0251858 | A1 | 10/2009 | Harada et al. | |
| 2009/0251859 | A1 | 10/2009 | Harada et al. | |
| 2012/0300521 | A1 | 11/2012 | Hida | |
| 2013/0265808 | A1* | 10/2013 | Ishii | H02M 1/12 363/97 |
| 2014/0092663 | A1* | 4/2014 | Shimizu | H02M 7/003 363/141 |
| 2014/0160822 | A1* | 6/2014 | Kuwano | H02M 7/003 363/141 |
| 2014/0197532 | A1* | 7/2014 | Ide | H01L 23/36 257/706 |

FOREIGN PATENT DOCUMENTS

| | | |
|---|---|---|
| JP | 2007-226996 | 9/2007 |
| JP | 2009-240037 | 10/2009 |
| JP | 2010-16941 | 1/2010 |
| JP | 2013-9581 | 1/2013 |
| JP | 2013-106503 | 5/2013 |
| JP | 2013-126360 | 6/2013 |

* cited by examiner

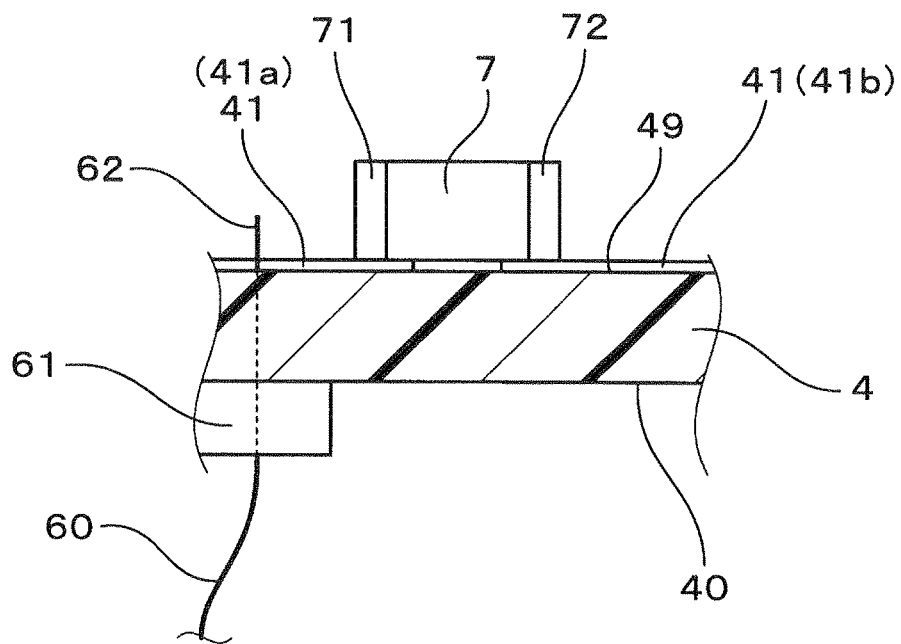
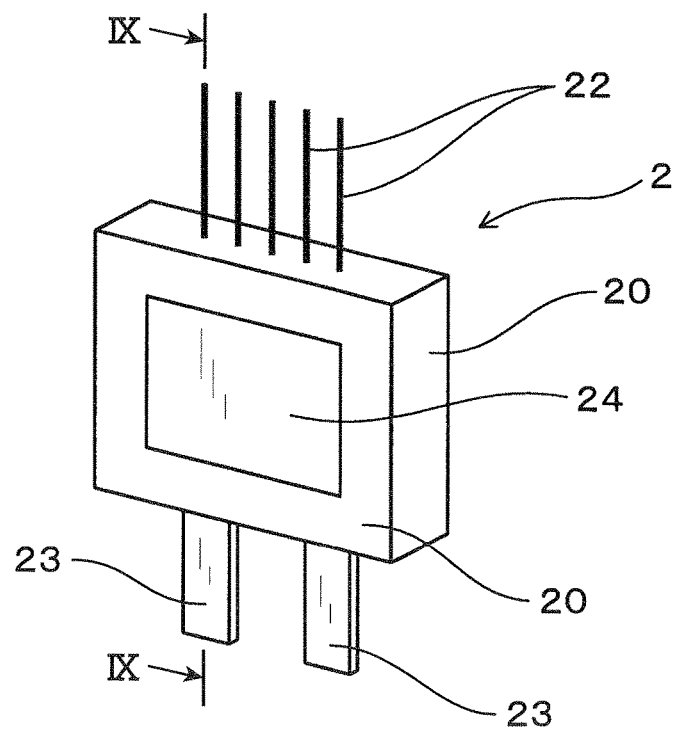

COMPARATIVE EXAMPLE

ELECTRIC POWER CONVERTOR

CROSS-REFERENCE TO RELATED APPLICATION

This application is based on and claims the benefit of priority from earlier Japanese Patent Applications No. 2014-2061 filed Jan. 9, 2014, and No. 2014-228145 filed Nov. 10, 2014, the descriptions of which are incorporated herein by references.

TECHNICAL FIELD

The present disclosure relates to an electric power converter that has a semiconductor module with a built-in switching element and a cooler for cooling the semiconductor module.

BACKGROUND

A device that has a plurality of semiconductor modules with built-in switching elements such as an IGBT element, and a pair of DC (direct current) bus bars (a positive bus bar and a negative bus bar) is known as an electric power converter that converts power between a DC power and AC power, for example (refer to Japanese Patent Application Laid-Open Publication No. 2009-240037). In this electric power converter, the DC power from DC power supply is supplied to the semiconductor module via the pair of DC bus bars. Then, by switching on or off the switching element, the DC power is converted to AC power, and an AC load is configured to be driven by using the obtained AC power.

When the switching element is switched on or off, a noise current is generated. This noise current may be transmitted to an external device such as the DC power supply through the DC bus bars if not sufficiently removed. Therefore, efforts to sufficiently remove the noise current have been studied.

For example, a bypass capacitor is disposed in the electric power converter, and the DC bus bars and ground are connected through the bypass capacitor. Accordingly, the noise current generated from the switching element flows through the DC bus bars, and flows to ground through the bypass capacitor. Therefore, it is possible to suppress the problem of the noise current being transmitted to the external device.

However, even if the bypass capacitor is disposed, there is a problem that a frequency band of the noise current that can be removed is narrow. In other words, a relatively large parasitic inductance L exists to the switching element that is a source of the noise current and the DC bus bar or the like that connects the bypass capacitor and the switching element. Assuming that a capacitance of the bypass capacitor is C and the frequency of the noise current is f, an impedance Z from the switching element to ground is represented by the following formula.

$$Z = 2\pi f L + 1/(2\pi f C)$$

As can be seen from this formula, when the parasitic inductance L is large, it is possible to reduce a term $2\pi f L$ when the frequency f of the noise current is low. Moreover, even when the frequency f is low, a term $1/(2\pi f C)$ can also be reduced if the capacitance C of the bypass capacitor is sufficiently increased. Therefore, for noise current with a low frequency f, it is possible to reduce the overall impedance Z, and the noise current can flow to ground through the bypass capacitor.

However, when the frequency f of the noise current becomes high, the overall impedance Z increases because the term of $2\pi f L$ increases. Therefore, noise current with a high frequency f hardly flows to ground. Thus, an electric power converter that can remove not only a noise current with a low frequency f, but can remove a noise current with a high frequency, that is, an electric power converter capable of removing a noise current of a wider frequency band is desired.

SUMMARY

An embodiment provides an electric power converter capable of removing a noise current of a wider frequency band.

In an electric power converter according to a first aspect, the electric power converter includes a semiconductor module with a built-in switching element, a cooler for cooling the semiconductor module, a control circuit board for controlling an operation of the switching element, and a pair of direct current bus bars connected to the semiconductor module, and serve as current paths between a direct current power supply and the switching element, characterized in that the cooler is made of metal and electrically connected to ground, the semiconductor module has a metal heat radiating plate connected to the switching element, and an insulating layer is interposed between the heat radiating plate and the cooler that insulates them and a proximal bypass capacitor is formed close to the switching element by the heat radiating plate, the insulating layer, and the cooler, and there is provided at least a pair of distal bypass capacitors, each of which has a larger capacitance than the proximal bypass capacitor has, connects between each of the direct current bus bar and ground, and has a current path to the switching element of which a length is longer than a current path to the switching element from the proximal bypass capacitor.

In the electric power converter, two kinds of bypass capacitors, namely the proximal bypass capacitor and the distal bypass capacitor are provided.

Accordingly, it becomes possible to widen the frequency band of the noise current that can be removed. That is, the proximal bypass capacitor is formed by the heat radiating plate of the semiconductor module, the cooler, and the insulating layer interposed therebetween. For that reason, the proximal bypass capacitor is present in an immediate vicinity of the switching element which is a source of the noise current. Therefore, a parasitic inductance occurring between the switching element and the proximal bypass capacitor can be made small enough so as to be neglected. In such a case, when a capacitance of the proximal bypass capacitor is set to $C_1$, impedance $Z_1$ between the switching elements and ground can be expressed approximately by the following equation.

$$Z_1 = 1/(2\pi f C_1)$$

Thus, since the parasitic inductance is negligibly small, a term $(2\pi f L)$ by the parasitic inductance does not become large, and the impedance $Z_1$ becomes a small value even the frequency f of the noise current is high. Therefore, noise current with a high frequency f can flow to ground via the proximal bypass capacitor.

On the other hand, since the length of a current path to the switching element from the distal bypass capacitor is longer than that from the proximal bypass capacitor, a relatively large parasitic inductance L occurs to this current path. Therefore, when a capacitance of the distal bypass capacitor is set to $C_2$, impedance $Z_2$ between the switching elements and ground is expressed by the following equation.

$$Z_2=2\pi fL+1/(2\pi fC_2)$$

Unlike the proximal bypass capacitors, since the distal bypass capacitor can be formed using dedicated electronic components, the capacitance $C_2$ of the distal bypass capacitor can be increased. Therefore, a term $1/(2\pi fC_2)$ can be reduced even the frequency f of the noise current is low. In addition, since a term $2\pi fL$ is also reduced for noise current with a low frequency f, it is possible to reduce the overall impedance $Z_2$. Therefore, noise current with a low frequency f can flow to ground via the distal bypass capacitor.

As described above, noise current with a high frequency f can be removed by the proximal bypass capacitor, and noise current with a low frequency f can be removed by the distal bypass capacitor. Therefore, it becomes possible to remove noise current within a wider frequency band.

As described above, according to the present disclosure, an electric power converter capable of removing a noise current in a wide frequency band can be provided.

BRIEF DESCRIPTION OF THE DRAWINGS

FIG. 7 shows a sectional view taken along a line VII-VII of FIG. 2;

FIG. 8 shows a perspective view of a semiconductor module in the first embodiment;

DETAILED DESCRIPTION OF THE PREFERABLE EMBODIMENTS

Figure 1:
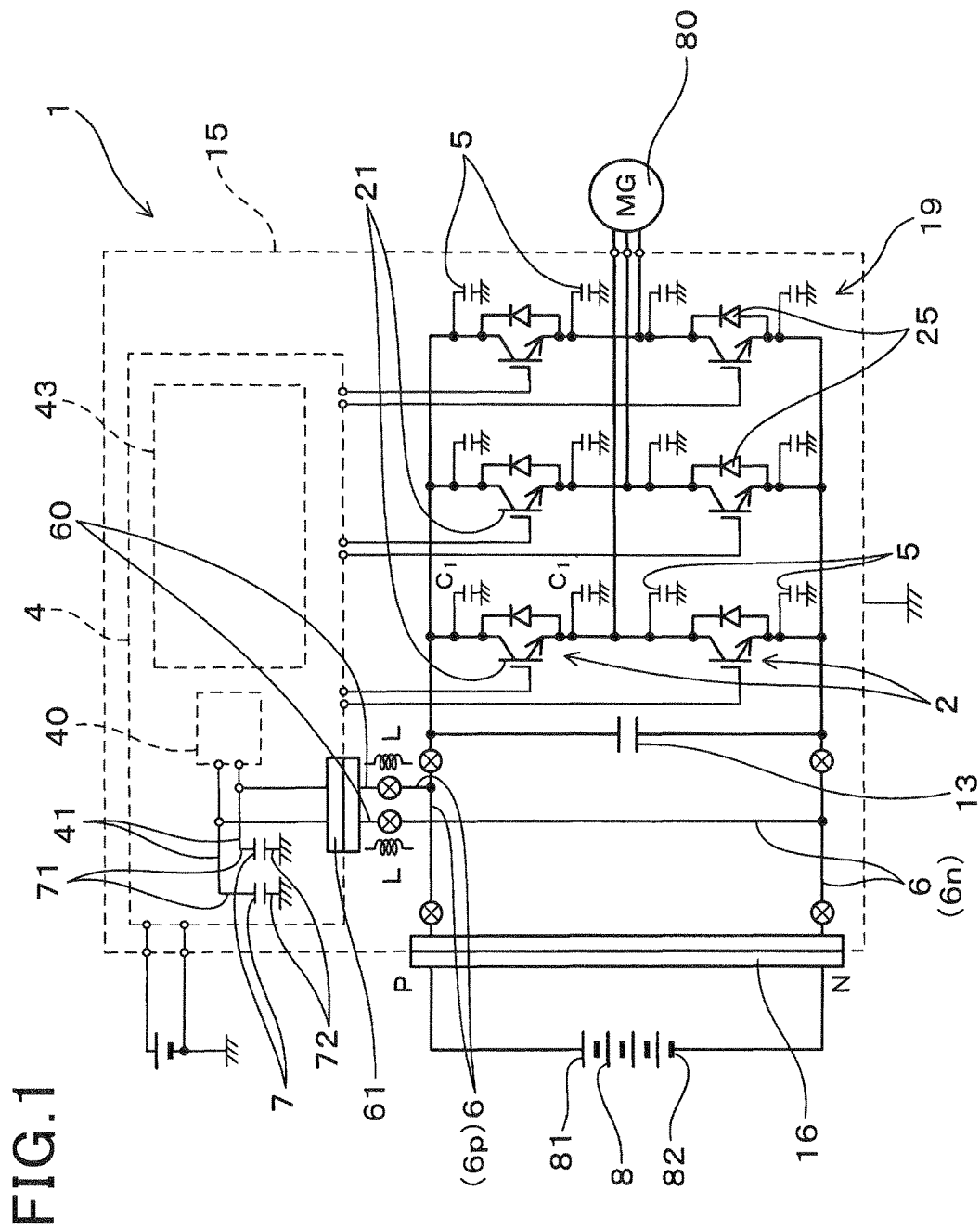
FIG. 1 shows a circuit diagram of an electric power converter in a first embodiment.

An electric power converter may be an electric power converter for vehicles mounted on a vehicle such as electric vehicles and hybrid vehicles, for example.

First Embodiment

An embodiment according to an electric power converter will be described with reference to FIGS. 1-7. As shown in FIG. 3 and FIG. 5, an electric power converter 1 of the present embodiment has a semiconductor module 2, a cooler 3, a control circuit board 4, and a pair of DC (direct current) bus bars 6.

The semiconductor module 2 has a built-in switching element 21 (refer to FIG. 1). The cooler 3 is a tubular member, and the semiconductor module 2 is cooled by using the cooler 3. Further, the control circuit board 4 controls an on-off operation of the switching element 21. The DC bus bars 6 are connected to power terminals 23 of the semiconductor module 2. The DC bus bars 6 serve as current paths between a DC power supply 8 (refer to FIG. 1) and the switching elements 21.

Figure 6:
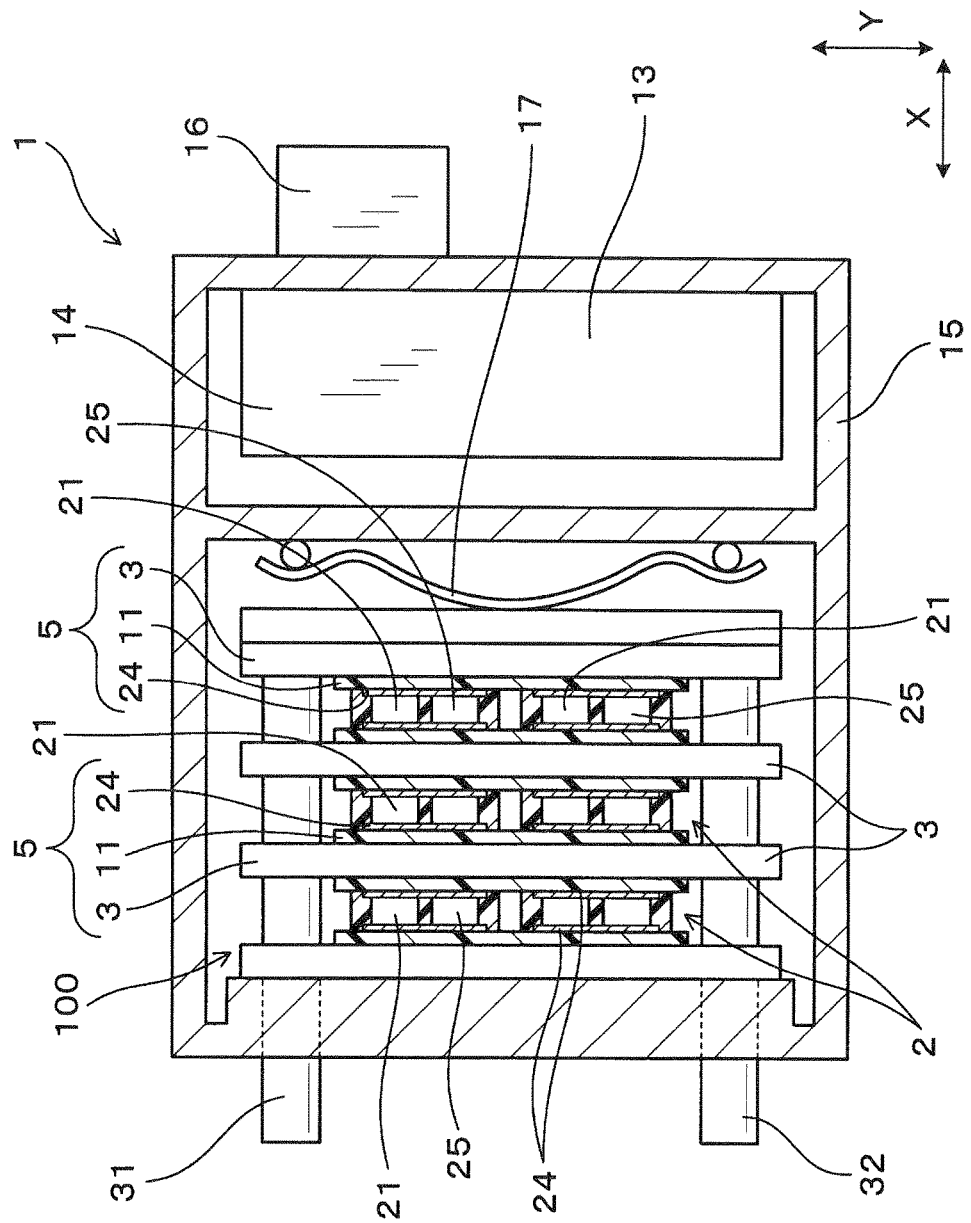
FIG. 6 shows a sectional view taken along a line VI-VI of FIG. 3.

The cooler 3 is made of metal. The cooler 3 is connected to ground through a case 15. As shown in FIG. 6, the semiconductor module 2 is provided with a metal heat radiating plate 24 connected to the switching element 21. An insulating layer 11 is interposed between the heat radiating plate 24 and the cooler 3 that insulates them. A proximal bypass capacitor 5 is formed close to the switching element 21 by the heat radiating plate 24, the insulating layer 11, and the cooler.

Figure 2:
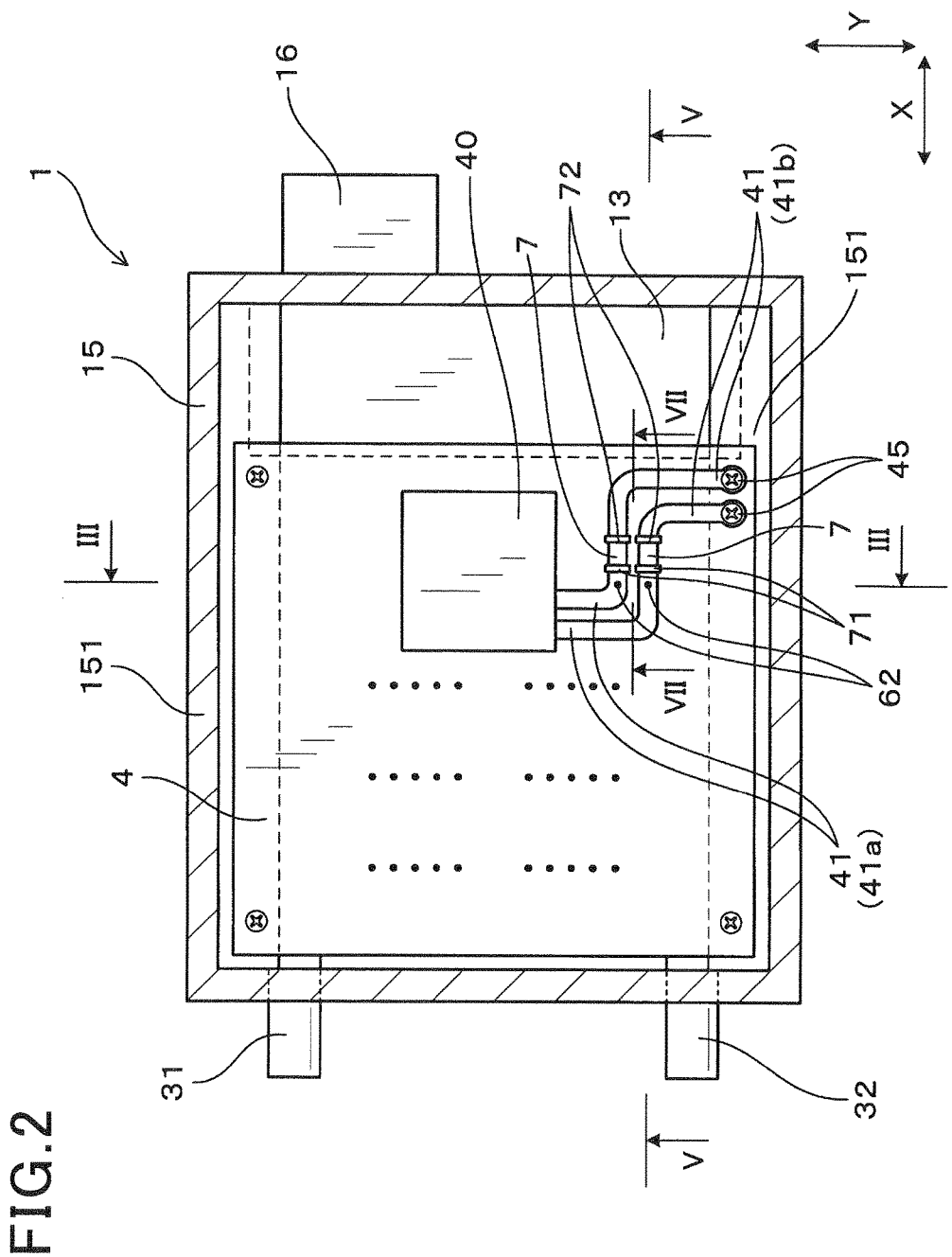
FIG. 2 shows a sectional view of the electric power converter in the first embodiment, and shows the sectional view taken along a line II-II of FIG. 3.
Figure 3:
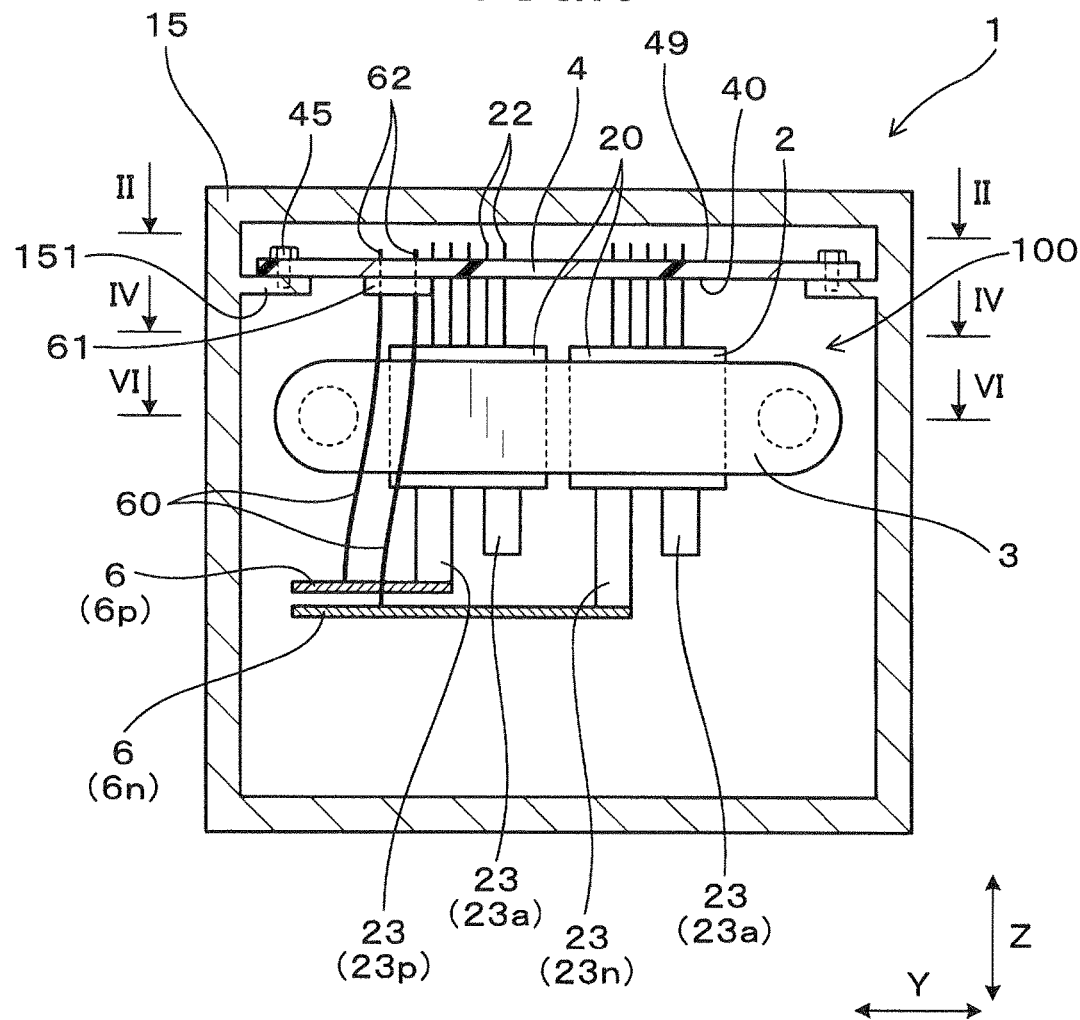
FIG. 3 shows a sectional view taken along a line III-III of FIG. 2.

As shown in FIG. 1 and FIG. 2, the electric power converter 1 is provided with a pair of distal bypass capacitors 7. Each distal bypass capacitor 7 has a larger capacitance than the proximal bypass capacitor 5 has. In addition, each distal bypass capacitor 7 connects the DC bus bars 6p, 6n, and ground. A length of the current path to the switching element 21 from the distal bypass capacitor 7 is longer than that of the proximal bypass capacitor 5.

The electric power converter 1 in the present embodiment an electric power converter for vehicles mounted on a vehicle such as electric vehicles and hybrid vehicles.

As shown in FIG. 1, in the electric power converter 1 of the present embodiment, an inverter circuit 19 is constituted by using a plurality of switching elements 21 (IGBT elements). Then, by switching on or off the switching elements 21, a DC power supplied from the DC power supply 8 is converted to an AC power, and a three phase AC motor 80 is configured to be driven by using the AC power.

As described above, in the present embodiment, the DC power supply 8 and the switching elements 21 are connected by the pair of DC bus bars 6. In the DC bus bars 6, there is a positive bus bar 6p connected to a positive electrode 81 of the DC power supply 8, and there is a negative bus bar 6n connected to a negative electrode 82 of the DC power supply 8.

As shown in FIG. 1 and FIG. 2, in the present embodiment, the distal bypass capacitors 7 are disposed on the control circuit board 4. The distal bypass capacitor 7 is formed of a ceramic capacitor. A main control unit 43 and a potentiometric circuit 40 are formed on the control circuit board 4. The main control unit 43 controls an operation of the switching element 21. The potentiometric circuit 40 measures a potential difference between the pair of DC bus bars 6p, 6n, that is, a voltage of the DC power supply 8. The potential difference measured by the potentiometric circuit 40 is constituted to be used by the main control unit 43 for controlling the operation of the switching element 21.

As shown in FIG. 1 and FIG. 2, ones of electrodes 71 of the distal bypass capacitors 7 are connected to the DC bus bars 6p, 6n, respectively, and the other ones of electrodes 72 are connected to ground. As shown in FIG. 2, wirings 41a, 41b are formed on a surface of the control circuit board 4. The wiring 41a, 41b are printed wirings. Among the two types of wirings 41a, 41b, the distal bypass capacitor 7 and the potentiometric circuit 40 are connected by one of the wirings 41a.

In addition, the distal bypass capacitor 7 is connected to a bolt 45 by the other one of the wirings 41b. As shown in FIG. 3, the bolt 45 is screwed to a rib 151 formed in the case 15. The case 15 is made of metal, and is connected to ground. Thus, the distal bypass capacitor 7 is configured to be connected to ground through the wiring 41b, the bolt 45, and the case 15.

Moreover, as shown in FIG. 3 and FIG. 7, among surfaces of the control circuit board 4, a connector 61 is attached to a surface (hereinafter, also referred to as a back surface 40) opposite of a surface 49 where the distal bypass capacitors 7 are disposed. The connector 61 and the DC bus bars 6p, 6n are connected by wires 60. Connecting pins 62 of the connector 61 penetrate through the control circuit board 4, and are connected to the wirings 41a, as shown in FIG. 2. Thus, the DC bus bars 6p, 6n, are configured to be electrically connected to the potentiometric circuit 40, while be electrically connected to the distal bypass capacitor 7 by electrically connecting the DC bus bars 6p, 6n to the wirings 41a.

Next, a structure of the semiconductor module 2 will be described. As shown in FIG. 8, the semiconductor module 2 of the present embodiment has a main body 20 having a built-in switching element 21 (refer to FIG. 1), and control terminals 22 and power terminals 23 projecting from the main body 20. The main body 20 is formed in a quadrilateral plate. In addition to the switching element 21, the main body 20 has a built-in freewheel diode 25 connected reversely in parallel to the switching element 21 (refer to FIGS. 1 and 6). The heat radiating plate 24 is exposed from the surface of the main body 20.

As shown in FIG. 6, each of the semiconductor modules 2 has two heat radiating plates 24. The switching element 21 and the freewheeling diode 25 are interposed between the two heat radiating plates 24. Each of the heat radiating plates 24 is soldered to electrodes of the switching element 21 and the freewheeling diode 25.

Figure 9:
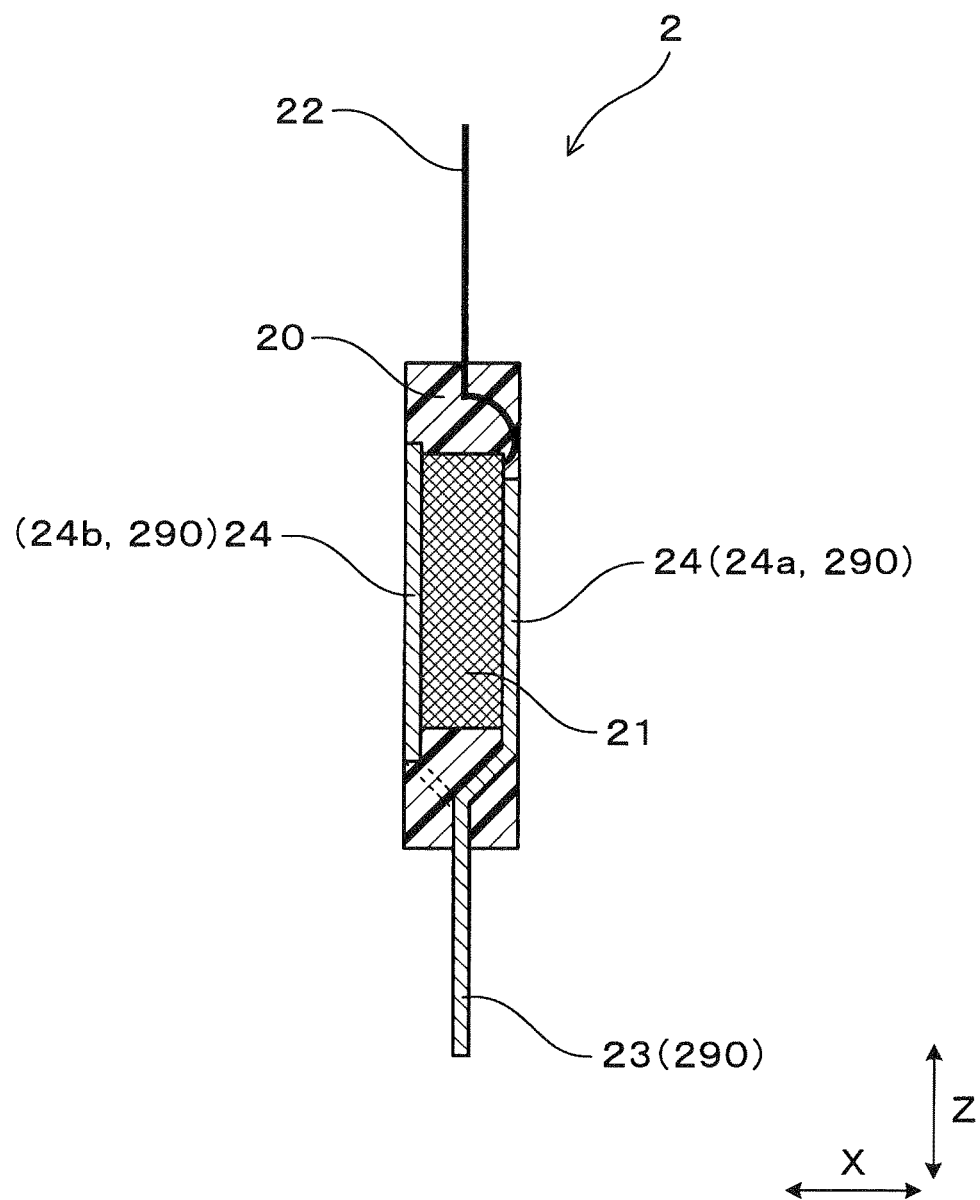
FIG. 9 shows a sectional view taken along a line IX-IX of FIG. 8.

As shown in FIG. 9, in the present embodiment, the heat radiation plates 24 and the power terminals 23 are formed integrally by using metal plates 290. The metal plates 290 are bent in the main body 20. A part of the metal plate 290 serves as the heat radiating plate 24, and is connected to the switching element 21 and the freewheel diode 25. Another part of the metal plate 290 protrudes from the main body 20 and serves as the power terminal 23.

One of the heat radiating plates 24a among the two heat radiating plate 24 (24a, 24b) is connected to a collector electrode of the switching element 21 (IGBT elements) and to a cathode electrode of the freewheeling diode 25. The other one of the heat radiating plates 24b is connected to an emitter electrode of the switching element 21 and to an anode electrode of the freewheeling diode 25. Heat radiating plates 24a, 24b and the switching element 21 are connected by soldering (not shown). Similarly, the heat radiating plates 24a, 24b and the freewheel diode 25 are connected by soldering (not shown).

As shown in FIG. 6, in the present embodiment, a stacked body 100 is constituted by stacking a plurality of semiconductor modules 2 and the plurality of coolers 3 alternately. The insulating layer 11 is interposed between the cooler 3 and the heat radiating plate 24 that insulates them. The cooler 3 is electrically connected to the case 15 through an inlet pipe 31, an outlet pipe 32 or the like, which will be described later. The case 15 is connected to ground. Thus, the cooler 3 is configured to be electrically connected to ground through the inlet pipe 31 or the case 15. Further, as described above, the proximal bypass capacitor 5 is formed by the cooler 3, the radiator plate 24, and the insulating layer 1.

As shown in FIG. 3, the control terminals 22 of the semiconductor module 2 are connected to the control circuit board 4. Further, in the power terminals 23 of the semiconductor module 2, there are a positive terminal 23p and a negative terminal 23n to which the DC voltage is applied, and AC terminals 23a. The positive bus bar 6p is connected to the positive terminal 23p, and the negative bus bar 6n is connected to the negative terminal 23n.

Further, AC bus bars (not shown) are connected to the AC terminals 23a. Through the AC bus bars, the AC terminals 23a are configured to be connected to the three-phase AC motor 80 (refer to FIG. 1).

Figure 4:
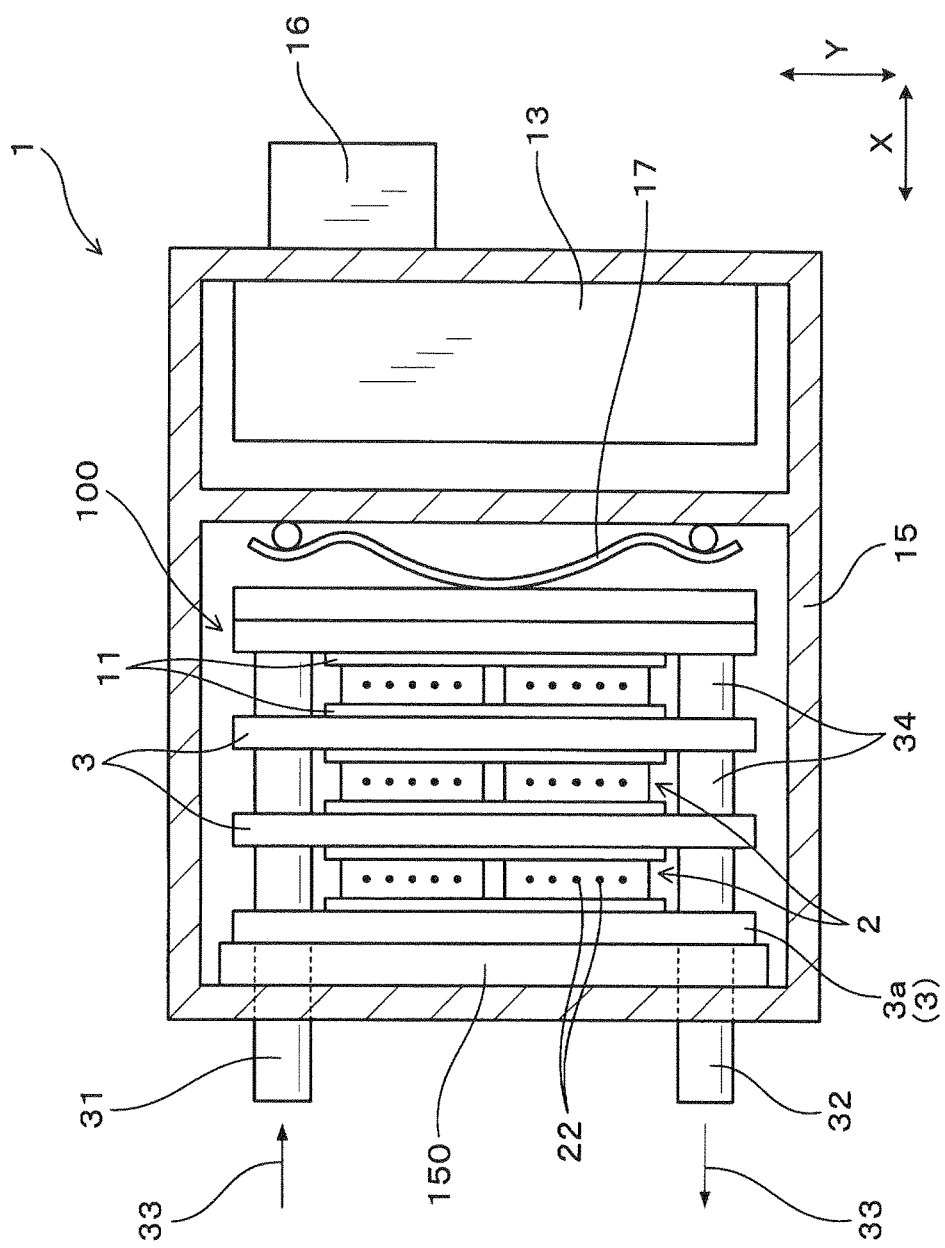
FIG. 4 shows a sectional view taken along a line IV-IV of FIG. 3.
Figure 5:
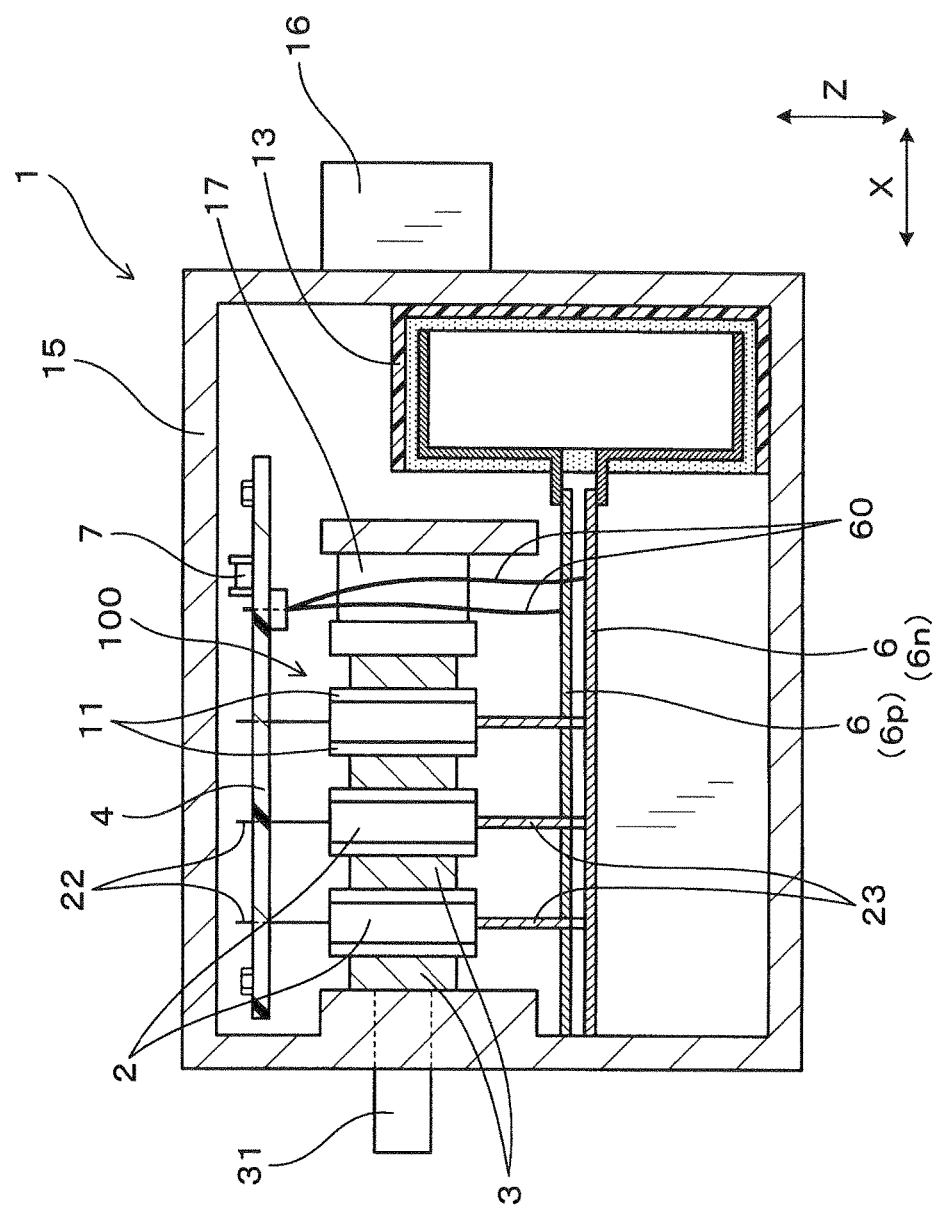
FIG. 5 shows a sectional view taken along a line V-V of FIG. 2.

As shown in FIG. 4, two coolers 3 that adjoin in a stacking direction of the stacked body 100 (X direction) are connected by connecting pipes 34. Moreover, the inlet pipe 31 for introducing the refrigerant 33 and the outlet pipe 32 for discharging the refrigerant 33 are connected to a cooler 3a located at one end in the X direction among the plurality of coolers 3. When the refrigerant 33 is introduced from the inlet pipe 31, the refrigerant 33 flows all the coolers 3 through the connecting pipes 34, and discharged from the outlet pipe 32. Thereby, it is configured to cool the semiconductor modules 2.

In addition, a pressure member 17 (leaf spring) is disposed in a position adjacent to the stacked body 100 in the X direction. The stacked body 100 is pressed against a wall portion 150 of the case 15 by pressing the stacked body 100 in the X-direction using the pressure member 17. Thus, while ensuring a contact pressure between the coolers 3 and the semiconductor modules 2, the stacked body 100 is fixed in the case 15.

Further, as shown in FIG. 5, a smoothing capacitor 13 for smoothing the DC voltage and an input connector 16 are disposed in the case 15. A connection cable (not shown) of the DC power supply 8 (refer to FIG. 1) is attached to the input connector 16. Further, the input connector 16 and the DC bus bars 6p, 6n, are connected by a conductive member (not shown). Thereby, the DC bus bars 6p, 6n are electrically connected to the DC power supply 8.

Functions and effects of the present embodiment are described. As shown in FIG. 1, the two kinds of bypass capacitors, namely the proximal bypass capacitor 5 and the distal bypass capacitor 7 are provided in the present embodiment.

Accordingly, it becomes possible to widen the frequency band of the noise current that can be removed. That is, as shown in FIG. 6, the proximal bypass capacitor 5 formed by the heat radiating plate 24 of the semiconductor module 2, the cooler 3, and the insulating layer 11 interposed therebetween. For that reason, the proximal bypass capacitor 5 is present in an immediate vicinity of the switching element 21 which is a source of the noise current. Therefore, the parasitic inductance occurring between the switching element 21 and the proximal bypass capacitor 5 can be made small enough so as to be neglected. In such a case, when a capacitance of the proximal bypass capacitor 5 is set to $C_1$, impedance $Z_1$ between the switching elements 21 and ground can be expressed approximately by the following equation.

$$Z_1 = 1/(2\pi f C_1)$$

Thus, since the parasitic inductance is negligibly small, a term (2πfL) by the parasitic inductance does not become large, and the impedance $Z_1$ becomes a small value even the frequency f of the noise current is high. Therefore, noise current with a high frequency f can flow to ground via the proximal bypass capacitor 5.

On the other hand, as shown in FIG. 1, since the length of a current path to the switching element 21 from the distal bypass capacitor 7 is longer than that from the proximal bypass capacitor 5, a relatively large parasitic inductance L occurs to this current path, especially to the wires 60. Therefore, when a capacitance of the distal bypass capacitor is set to $C_2$, impedance $Z_2$ between the switching elements 21 and ground is expressed by the following equation.

$$Z_2 = 2\pi f L + 1/(2\pi f C_2)$$

Unlike the proximal bypass capacitors 5, since the distal bypass capacitor 7 can be formed using dedicated electronic components, the capacitance $C_2$ of the distal bypass capacitor 7 can be increased. Therefore, a term 1/(2πfC₂) can be reduced even the frequency f of the noise current is low. In addition, since a term 2πfL is also reduced for noise current with a low frequency f, it is possible to reduce the overall impedance $Z_2$. Therefore, noise current with a low frequency f can flow to ground via the distal bypass capacitor 7.

As described above, noise current with a high frequency f can be removed by the proximal bypass capacitor 5, and noise current with a low frequency f can be removed by the distal bypass capacitor 7. Therefore, it becomes possible to remove noise current within a wider frequency band.

It should be noted that the heat radiating plate 24 and the cooler 3 are insulated by using the insulating layer 11 (refer to FIG. 6) in the present embodiment. Therefore, in order to sufficiently insulate between the heat radiating plate 24 and the cooler 3, it is necessary to use a thick insulating layer 11. Therefore, the capacitance C1 of the proximal bypass capacitor 5 becomes low inevitably. Specifically, the capacitance $C_1$ of the proximal bypass capacitor 5 is 100-1000 pF. In contrast, since the distal bypass capacitor 5 can be configured by using the electronic component, it is possible to increase the capacitance $C_2$. Specifically, the capacitance $C_2$ can be more than 1000 pF.

Further, as shown in FIG. 2, the bypass capacitors 7 are disposed on the control circuit board 4 in the present embodiment. Furthermore, the potentiometric circuit 40 and the distal bypass capacitors 7 are connected by wirings 41a formed on the control circuit board 4.

Accordingly, components (the wires 60) that connect the DC bus bars 6 to the potentiometric circuit 40 and components (the wires 60) that connect the DC bus bars 6 to the distal bypass capacitor 7 are not necessary to be provided separately, but these components can be commonly used. In other words, by using the common wires 60, the DC bus bars 6 can be connected to the potentiometric circuit 40 and the distal bypass capacitors 7. Therefore, it is possible to reduce the number of components, while it is possible to reduce the manufacturing cost of the electric power converter 1.

Further, the distal bypass capacitor 7 is formed of a ceramic capacitor in the present embodiment. Capacitance per unit volume of the ceramic capacitor is large. Therefore, it is possible to reduce the size of the distal bypass capacitor 7 when the ceramic capacitor is used.

Figure 22:
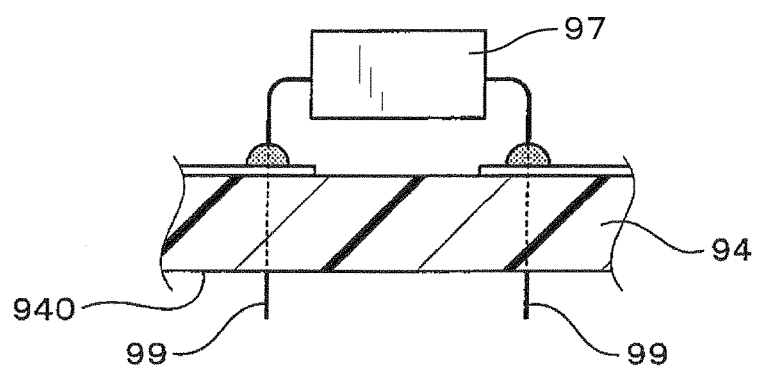
FIG. 22 shows a sectional view of a control circuit board in a comparative example.

Further, the distal bypass capacitor 7 is mounted on the surface of the control circuit board 4 as shown in FIG. 7 in the present embodiment. When assuming that a distal bypass capacitor 97 is mounted on a control circuit board 94 using through-holes, as shown in FIG. 22, terminals 99 of the distal bypass capacitor 97 will protrude from a back surface 940 of the control circuit board 94. Therefore, it becomes difficult to place other electronic components and the like on the back surface 940 of the control circuit board 94. As a result, it is difficult to effectively use the back surface 940.

On the contrary, as in the present embodiment, when the distal bypass capacitor 7 is mounted on the surface of the control circuit board 4, terminals of the distal bypass capacitor 7 will not cause problems by protruding from the back surface 40, and it will be easier to place other electronic components to the back surface 40. Therefore, it becomes easier to effectively utilize the back surface 40.

As described above, according to the present embodiment, it is possible to provide an electric power converter capable of removing the noise current across a wide frequency band.

Second Embodiment

It should be appreciated that, in the second embodiment and the subsequent embodiments, components identical with or similar to those in the first embodiment are given the same reference numerals, and structures and features thereof will not be described in order to avoid redundant explanation, unless otherwise indicated.

Figure 10:
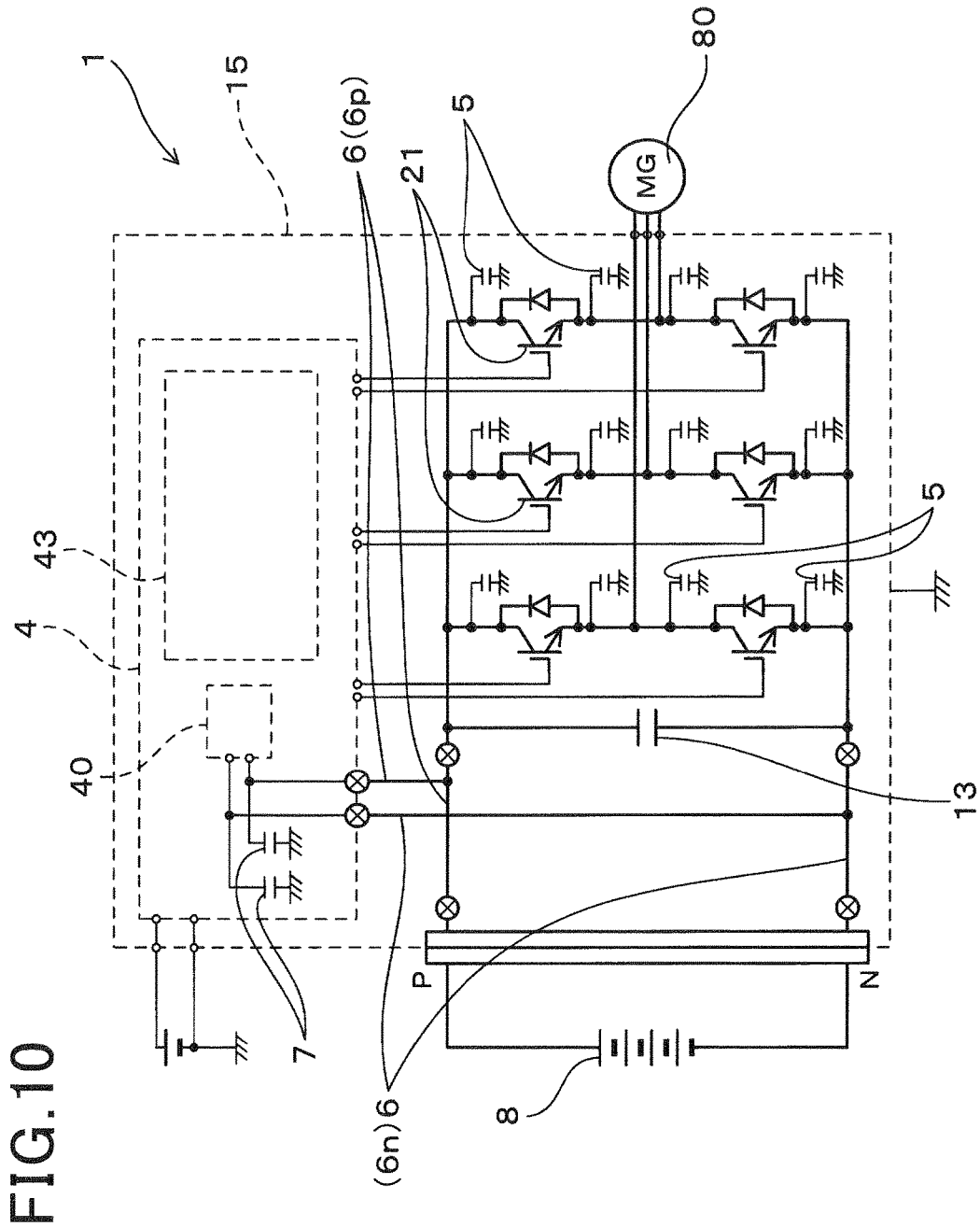
FIG. 10 shows a circuit diagram of the electric power converter in a second embodiment.
Figure 11:
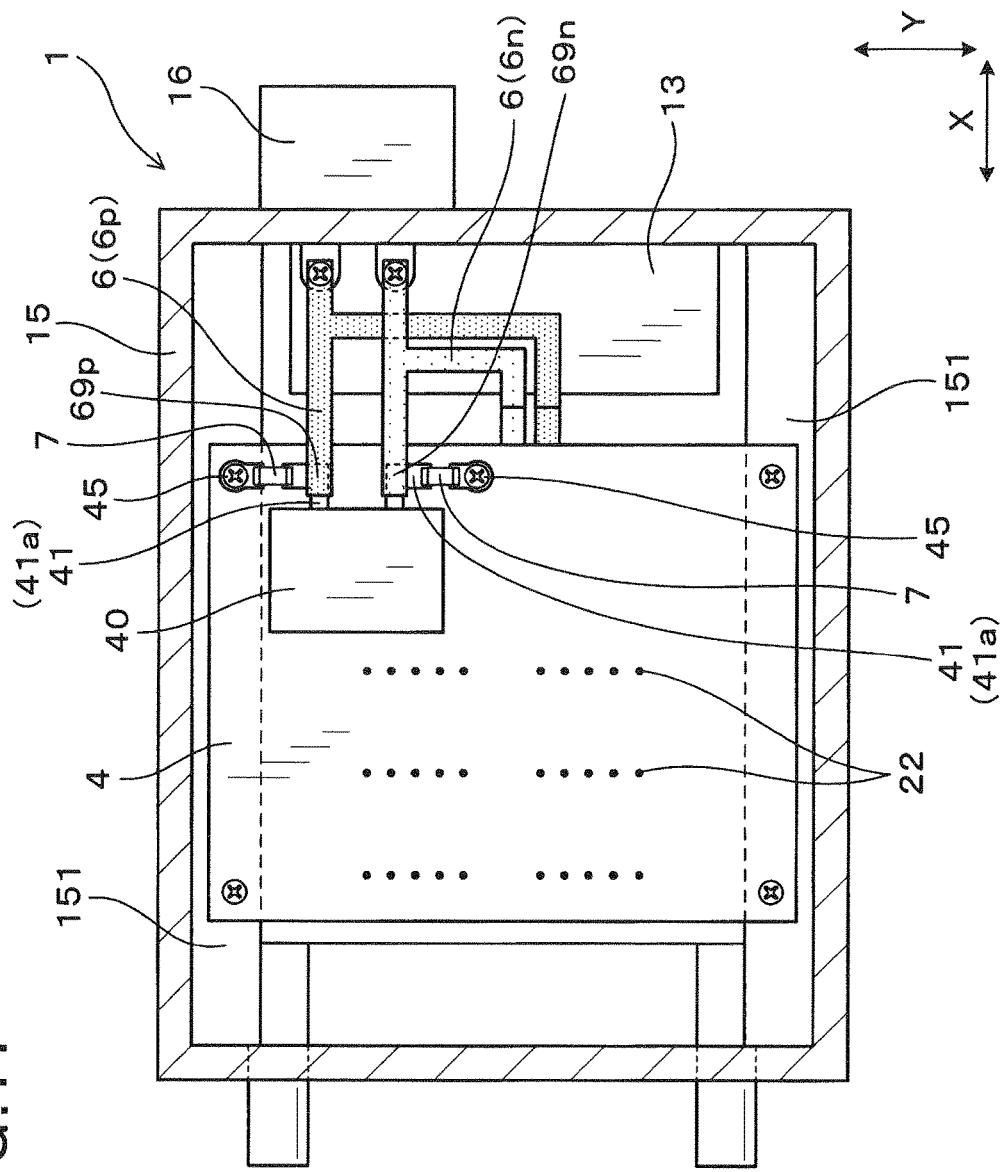
FIG. 11 shows a top view of the electric power converter in the second embodiment.

The present embodiment is an example of changing a connection structure between the distal bypass capacitors 7 and the DC bus bars 6p, 6n, as shown in FIG. 10 and FIG. 11. As shown in FIG. 11, parts of the DC bus bars 6 are placed on the control circuit board 4 in the present embodiment. Further, portions 69p, 69n of the DC bus bars 6 placed on the control circuit board 4 are connected to the distal bypass capacitors 7. The DC bus bars 6 are connected to the input connector 16.

In the present embodiment, the wirings 41 are printed and formed on the control circuit board 4 in the same manner as in the first embodiment. The potentiometric circuit 40 and the distal bypass capacitors 7 are connected by these wirings 41. In addition, the portions 69p, 69n of the DC bus bars 6 are respectively connected to the wirings 41. Thereby, it is constituted that while the DC bus bars 6 are electrically connect to the distal bypass capacitor 7, the DC bus bars 6 are electrically connected to the potentiometric circuit 40 as well.

Functions and effects of the present embodiment are described. In the present embodiment, since the parts of the DC bus bars 6 disposed directly on the control circuit board 4, there is no need to use dedicated components for connecting the DC bus bars 6 and the control circuit board 4. Therefore, it is possible to reduce the number of components, and it is possible to reduce the manufacturing cost of the electric power converter 1.

The second embodiment has the same configuration and effects as the first embodiment other than the above.

Third Embodiment

Figure 12:
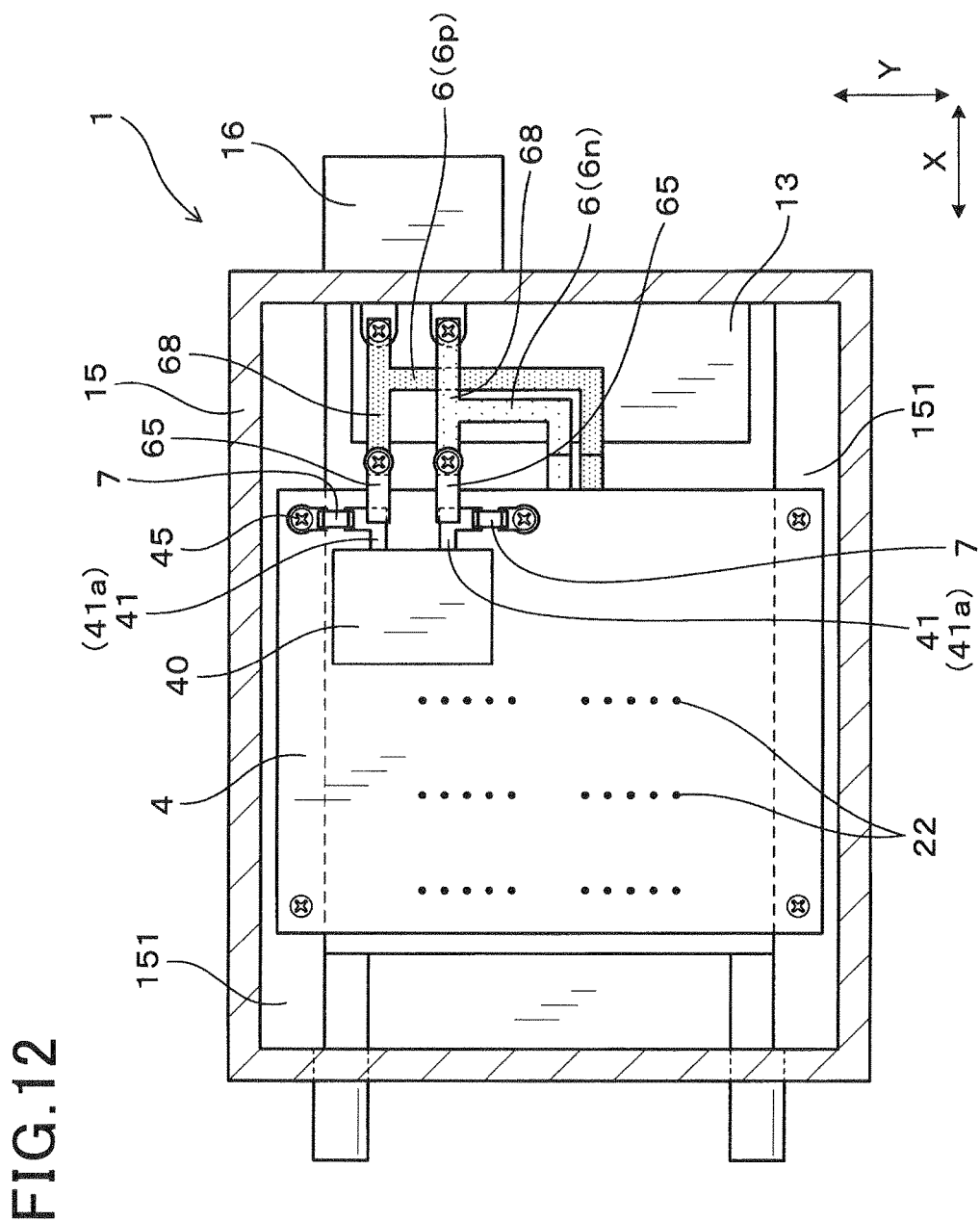
FIG. 12 shows a top view of the electric power converter in a third embodiment.

The present embodiment is an example that the connection structure of the distal bypass capacitor 7 and the DC bus bars 6 has been changed. As shown in FIG. 12, in the present embodiment, portions of the DC bus bars 6 connected to the input connector 16 (connector connecting portions 68) are disposed at the same height as the control circuit board 4 in a thickness direction of the control circuit board 4. Further, in the same manner as in the first embodiment, the potentiometric circuit 40 and the distal bypass capacitors 7 are connected by the wirings 41 formed on the control circuit board 4 by printing. Then, the connector connecting portions 68 and the wirings 41 are connected by metal connecting members 65. One end of the connecting member 65 is bolted to the connector connecting portion 68. In addition, another end of the connecting member 65 is soldered to the wiring 41.

The third embodiment has the same configuration and effects as the first embodiment other than the above.

Fourth Embodiment

Figure 13:
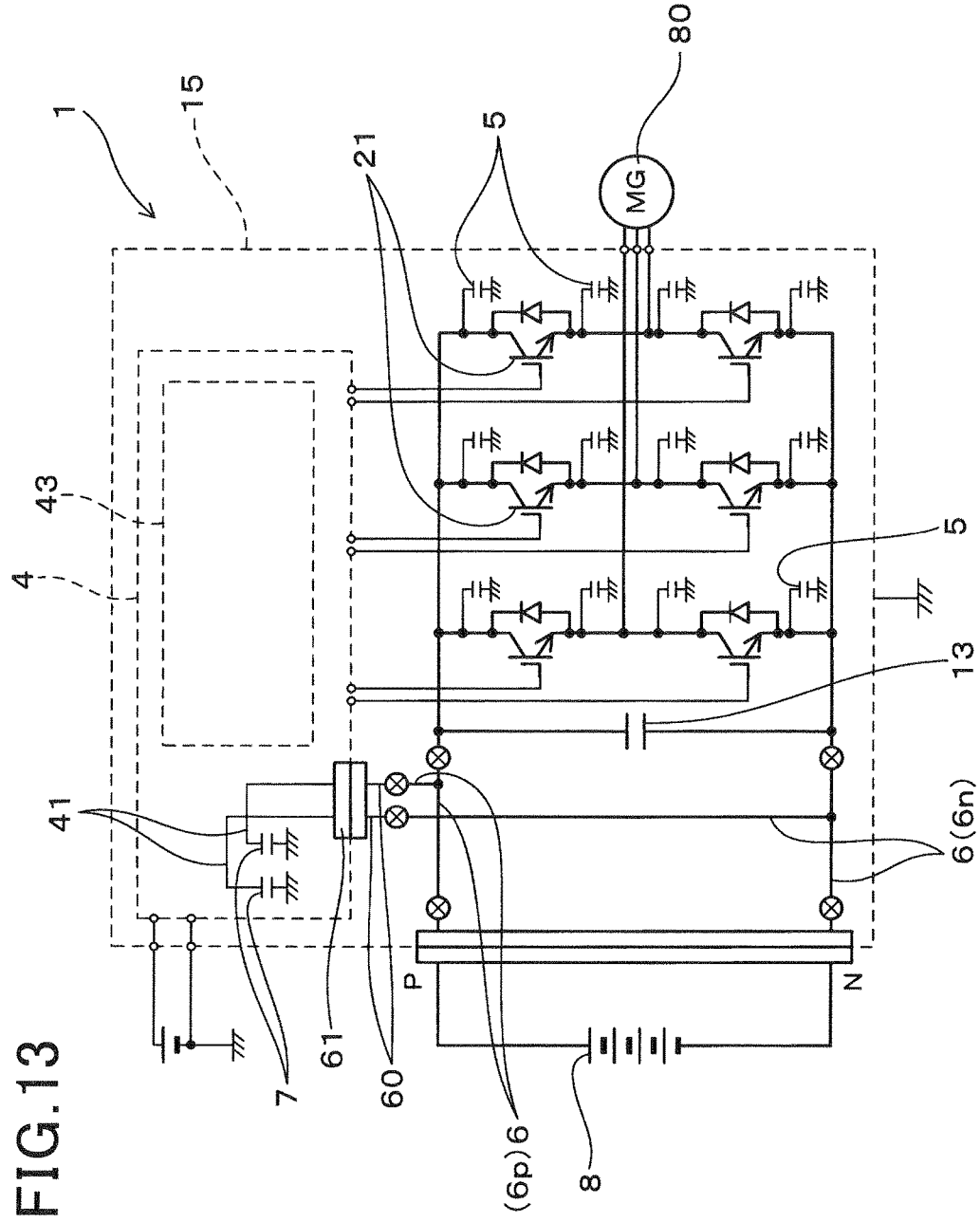
FIG. 13 shows a circuit diagram of the electric power converter in a fourth embodiment.

The present embodiment is an example of changing the circuit configuration of the control circuit board 4. As shown in FIG. 13 in the present embodiment, the potentiometric circuit 40 is not formed on the control circuit board 4. The wirings 41 are formed on the control circuit board 4, and the connector 61 and the distal bypass capacitors 7 are connected by the wirings 41. In addition, the connector 61 and the DC bus bars 6 are connected by the wires 60. Thereby, it is constituted that the DC bus bars 6 are electrically connected to the distal bypass capacitors 7.

The fourth embodiment has the same configuration and effects as the first embodiment other than the above.

Fifth Embodiment

Figure 14:
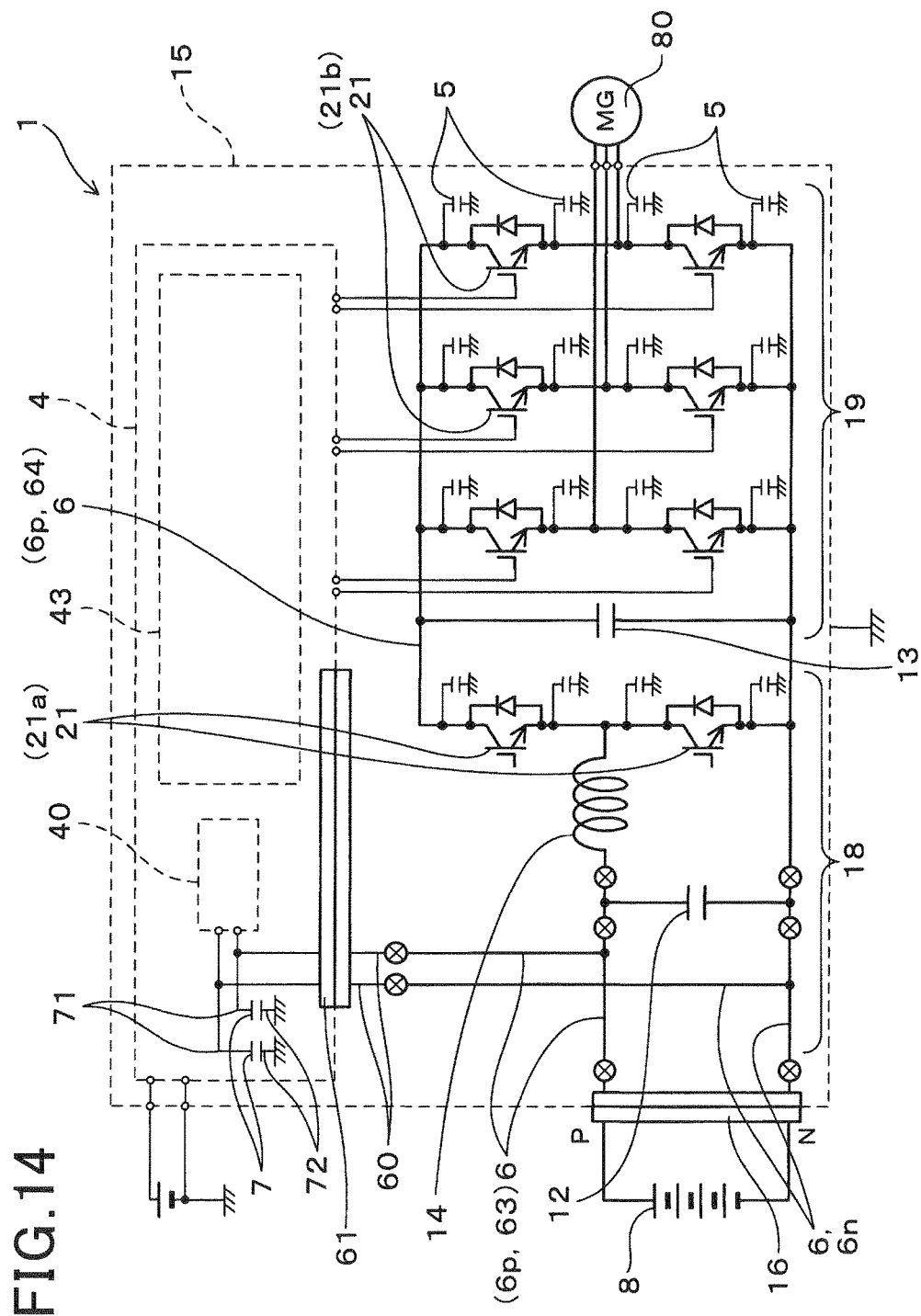
FIG. 14 shows a circuit diagram of the electric power converter in a fifth embodiment.

The present embodiment is an example of changing the circuit configuration of the electric power converter 1. In the present embodiment, as shown in FIG. 14, the electric power converter 1 is provided with a booster circuit 18. The booster circuit 18 has a filter capacitor 12, a reactor 14, and switching elements 21*a* for boosting. The DC voltage of the DC power supply 8 is boosted by using this booster circuit 18, and by switching on or off the switching elements 21*b* of the inverter circuit 19, the boosted DC voltage is converted into the AC voltage.

In the positive bus bar 6*p* of the present embodiment, there is a first portion 63 that constitutes the booster circuit 18 and a second portion 64 that constitutes the inverter circuit 19. The DC power supply 8 and the reactor 14 are connected by the first portion 63. Moreover, the booster circuit 18 and the inverter circuit 19 are connected by the second portion 64. The first portion 63 is connected to the distal bypass capacitors 7 and the potentiometric circuit 40. The voltage of the DC power supply 8 is measured by the potentiometric circuit 40.

The fifth embodiment has the same configuration and effects as the first embodiment other than the above.

Sixth Embodiment

Figure 15:
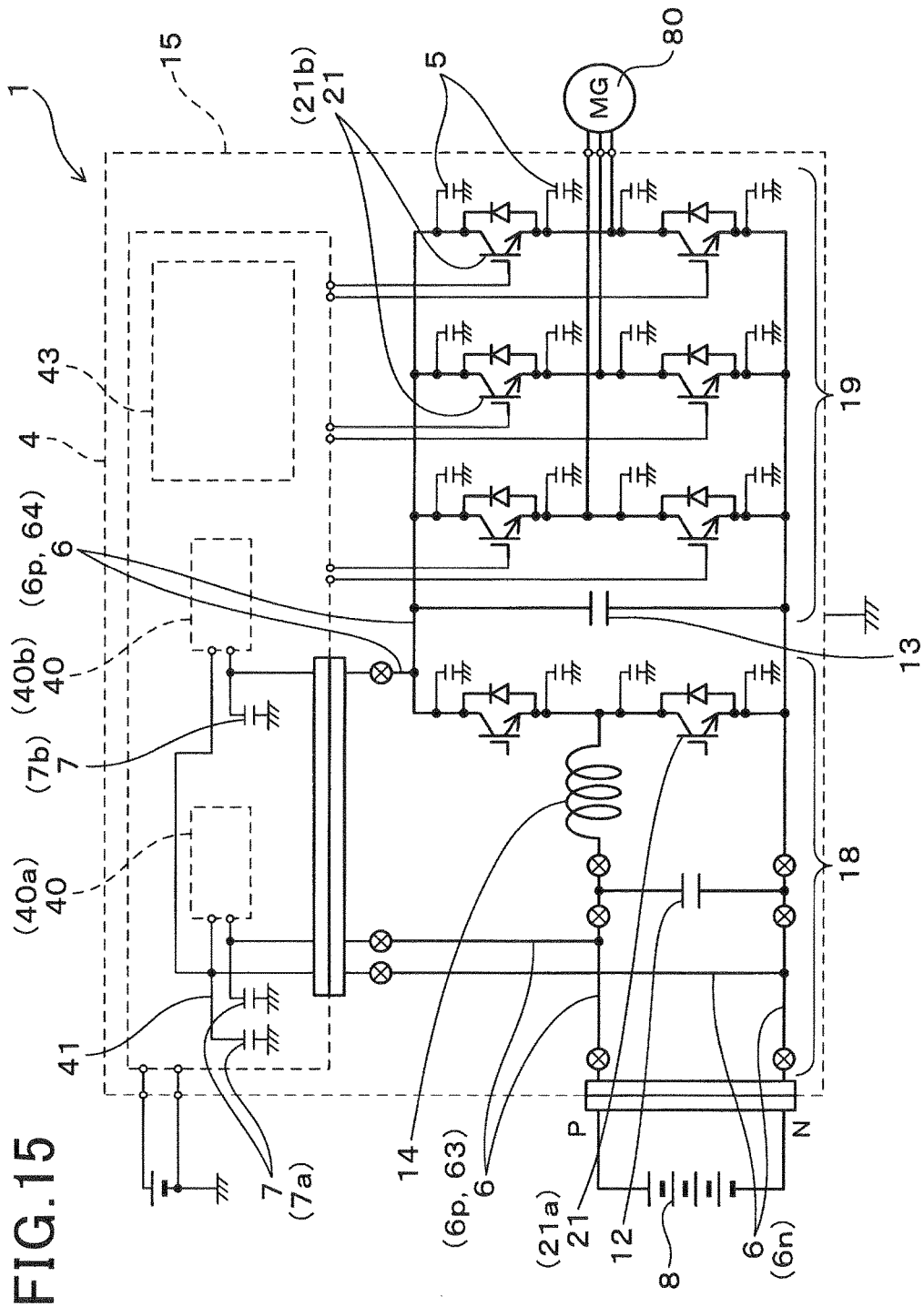
FIG. 15 shows a circuit diagram of the electric power converter in a sixth embodiment.

The present embodiment is an example of changing the circuit configuration of the electric power converter 1. In the present embodiment, as shown in FIG. 15, the booster circuit 18 and the inverter circuit 19 are formed in the same manner as in the fifth embodiment. Further, two potentiometric circuits 40, namely a first potentiometric circuit 40*a* and a second potentiometric circuit 40*b* are formed on the control circuit board 4 in the present embodiment. The first potentiometric circuit 40*a* is connected to the first portion 63 of the positive bus bar 6*p*, and the negative bus bar 6*n*. The voltage of the DC power supply 8 is measured by the first potentiometric circuit 40*a*. The second portion 64 of the positive bus bar 6*p* is connected to the second potentiometric circuit 40*b*. The voltage boosted by the booster circuit 18 is measured by the second potentiometric circuit 40*b*.

Further, two types of bypass capacitors 7, namely a first distal bypass capacitor 7*a* and a second distal bypass capacitor 7*b* are disposed on the control circuit board 4 in the present embodiment. The first distal bypass capacitors 7*a* connect the DC bus bars 6 (63,6*n*) that constitute the booster circuit 18 and ground. The second distal bypass capacitor 7*b* connects the second portion 64 of the positive bus bar 6*p* and ground. A noise current generated from the switching element 21*a* of the booster circuit 18 flows to ground by using the first distal bypass capacitors 7*a*. In addition, it is constituted that a noise current generated from the switching element 21*b* of the inverter circuit 19 flows to ground by using the second distal bypass capacitor 7*b*.

The sixth embodiment has the same configuration and effects as the fifth embodiment other than the above.

Seventh Embodiment

Figure 16:
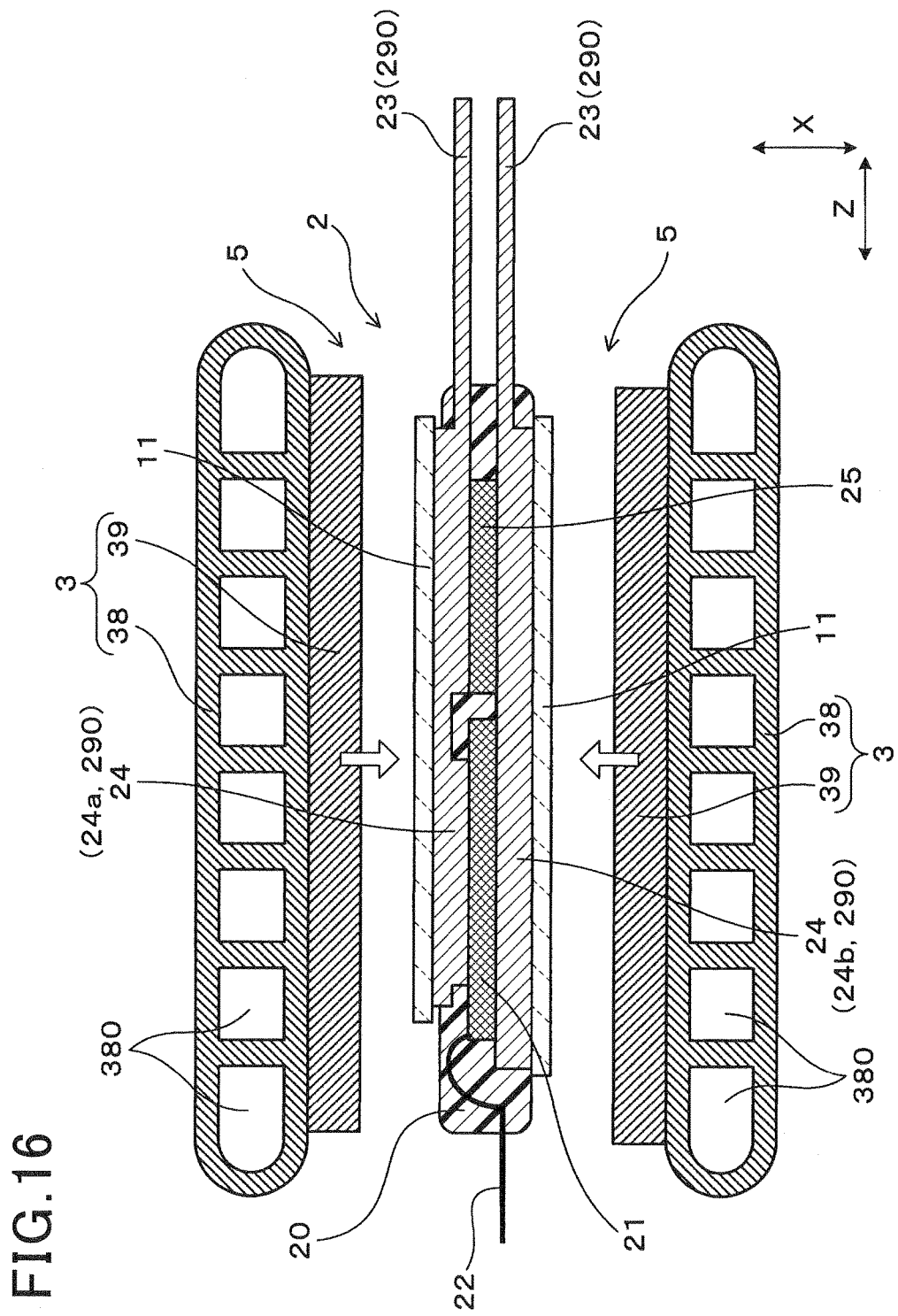
FIG. 16 shows an exploded sectional view of a semiconductor module and a cooler in a seventh embodiment.

The present embodiment is an example of changing the structures of the semiconductor module 2 and the cooler 3. As shown in FIG. 16, the semiconductor module 2 of the present embodiment has the switching element 21, the freewheel diode 25, the heat radiating plates 24, the power terminals 23, the control terminal 22, and the main body 20 made of a resin in the same manner as in the first embodiment. The heat radiating plates 24 and the power terminals 23 are integrally formed by the metal plates 290. Unlike the first embodiment (refer to FIG. 9), the metal plates 290 are not bent in the present embodiment. The power terminals 23 are formed thinner than the heat radiating plates 24. Furthermore, between the switching element 21 and the heat radiating plates 24 (24*a*, 24*b*), there is interposed a solder layer (not shown) that connects them. Similarly, between the free-wheeling diode 25 and the heat radiating plates 24 (24*a*, 24*b*), there is interposed the solder layer (not shown) that connects them.

Each cooler 3 has a flow path forming portion 38 and a heat sink 39 attached to the flow path forming portion 38. Coolant paths 380 are formed in the flow path forming portion 38. The heat sink 39 protrudes towards the semiconductor module 2 from the flow path forming portion 38. The insulating layer 11 is interposed between the heat sink 39 and the heat radiating plate 24. The proximal bypass capacitor 5 is formed by the heat sinks 39 of the coolers 3, the insulating layers 11, and the heat radiating plates 24.

Functions and effects of the present embodiment are described. In the present embodiment, the metal plates 290 are not bent in the main body 20. Therefore, it is possible to manufacture the semiconductor modules 2 easily. The cooler 3 of the present embodiment has the heat sink 39. Therefore, even when the switching element 21 generates large heat momentarily, it is possible that heat is absorbed by the heat sink 39. Therefore, in this case, the temperature of the switching element 21 can be suppressed from excessively increasing.

The seventh embodiment has the same configuration and effects as the first embodiment other than the above.

Eighth Embodiment

Figure 17:
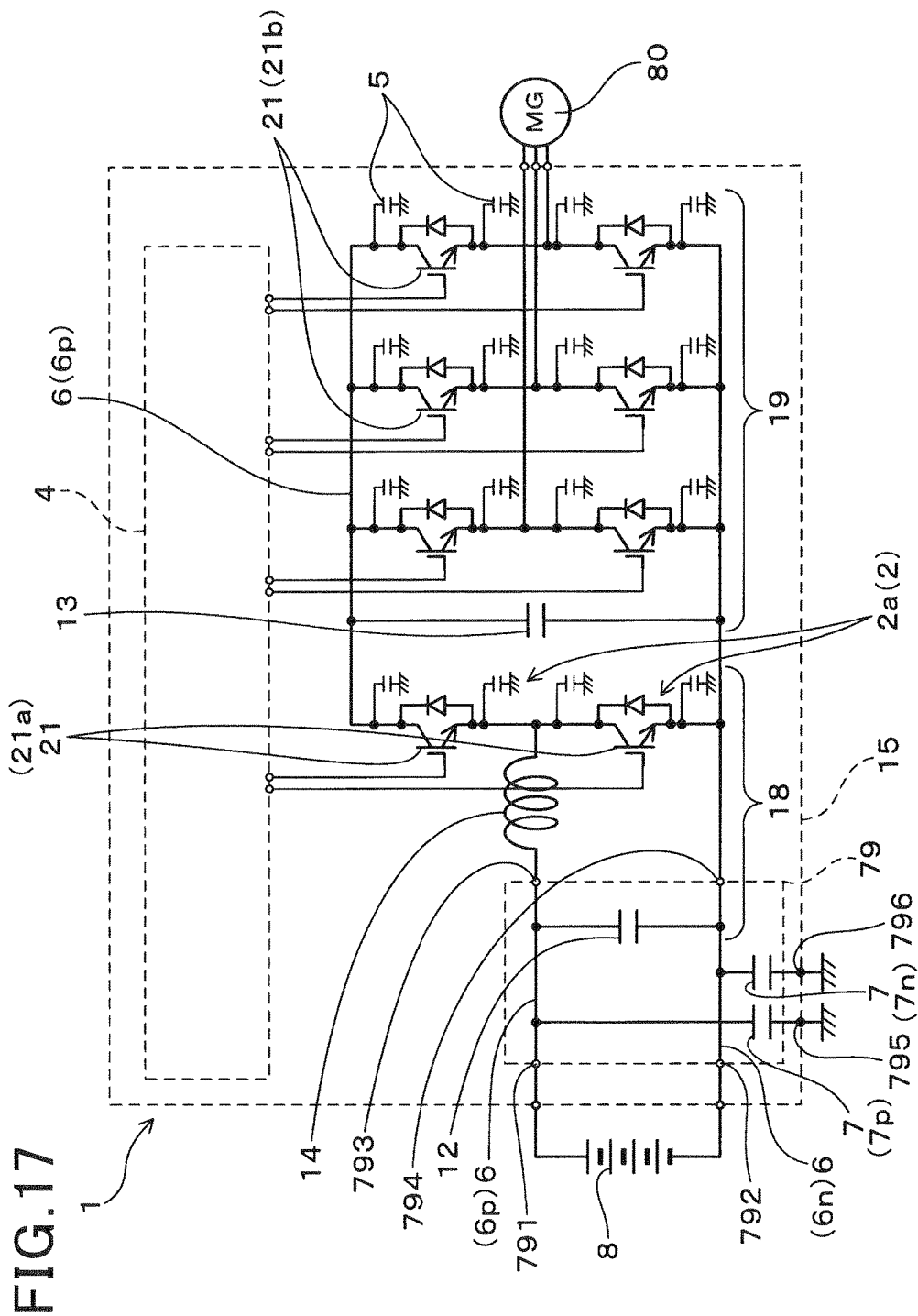
FIG. 17 shows a circuit diagram of the electric power converter in an eighth embodiment.

The present embodiment is an example of changing the disposing positions of the distal bypass capacitors 7. As shown in FIG. 17, the electric power converter 1 of the present embodiment has the inverter circuit 19 and the booster circuit 18 in the same manner as in the fifth embodiment. The booster circuit 18 is composed of the filter capacitor 12, the reactor 14, and the switching elements 21a for boosting. In the present embodiment, the distal bypass capacitors 7 (7p, 7n) are not disposed on the control circuit board 4. The distal bypass capacitors 7 (7p, 7n) are integrated together with the filter capacitor 12, and form a capacitor module 79.

In the distal bypass capacitors 7, there is a positive side distal bypass capacitor 7p disposed between the positive bus bar 6p and ground, and is a negative side distal bypass capacitor 7n disposed between the negative bus bar 6n and ground.

Figure 18:
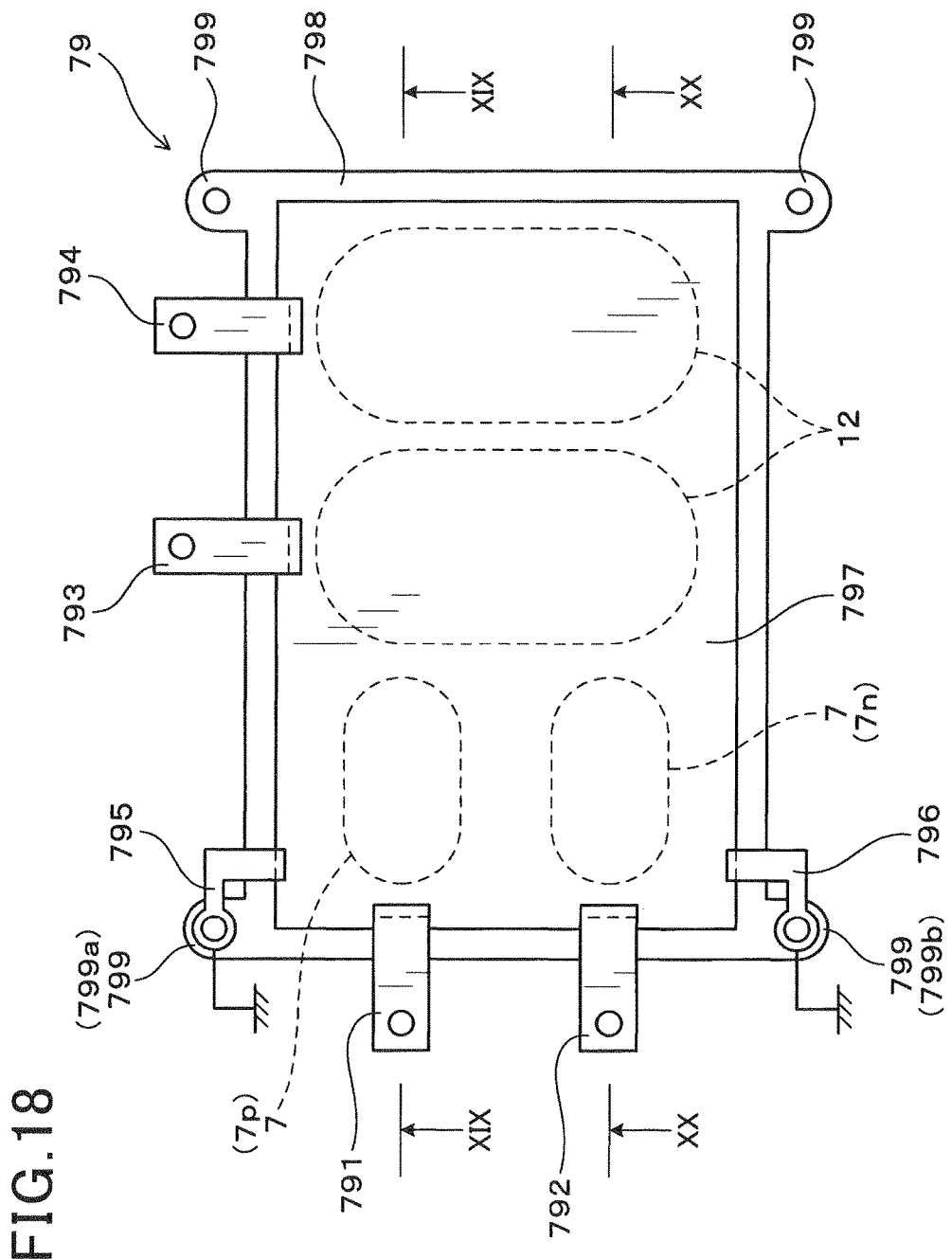
FIG. 18 shows a plan view of a capacitor module in the eighth embodiment, and shows an arrow XVIII view of FIG. 19.

As shown in FIG. 17 and FIG. 18, the capacitor module 79 has input terminals 791, 792, output terminals 793, 794, and ground terminals 795, 796. The input terminals 791, 792 are connected to the DC power supply 8. Further, one of the output terminals 793 among the two output terminals 793, 794 is connected to the reactor 14. Another one of the output terminals 794 is connected to the semiconductor module 2a for boosting. The ground terminals 795, 796 are connected to the case 15 of the electric power converter 1. The ground terminals 795, 796 are connected to ground via the case 15.

As shown in FIG. 18, the capacitor module 79 has a capacitor case 798. The filter capacitors 12 and the distal bypass capacitors 7 (7p, 7n) are accommodated in the capacitor case 798, and these are sealed by a sealing member 797 made of resin. The filter capacitor 12 and the distal bypass capacitor 7 (7p, 7n) are made of a so-called film capacitor.

Figure 19:
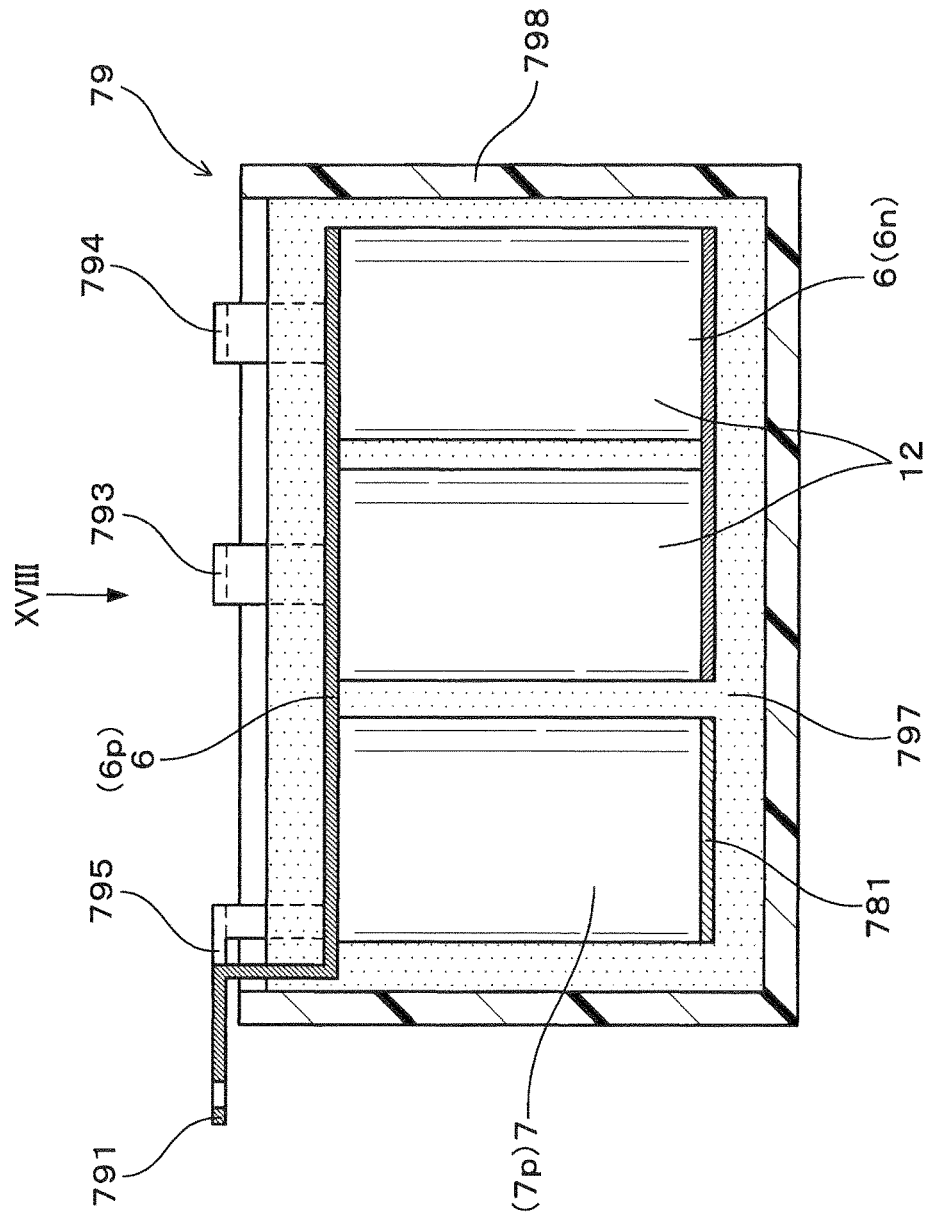
FIG. 19 shows a sectional view taken along a line XIX-XIX of FIG. 18.
Figure 20:
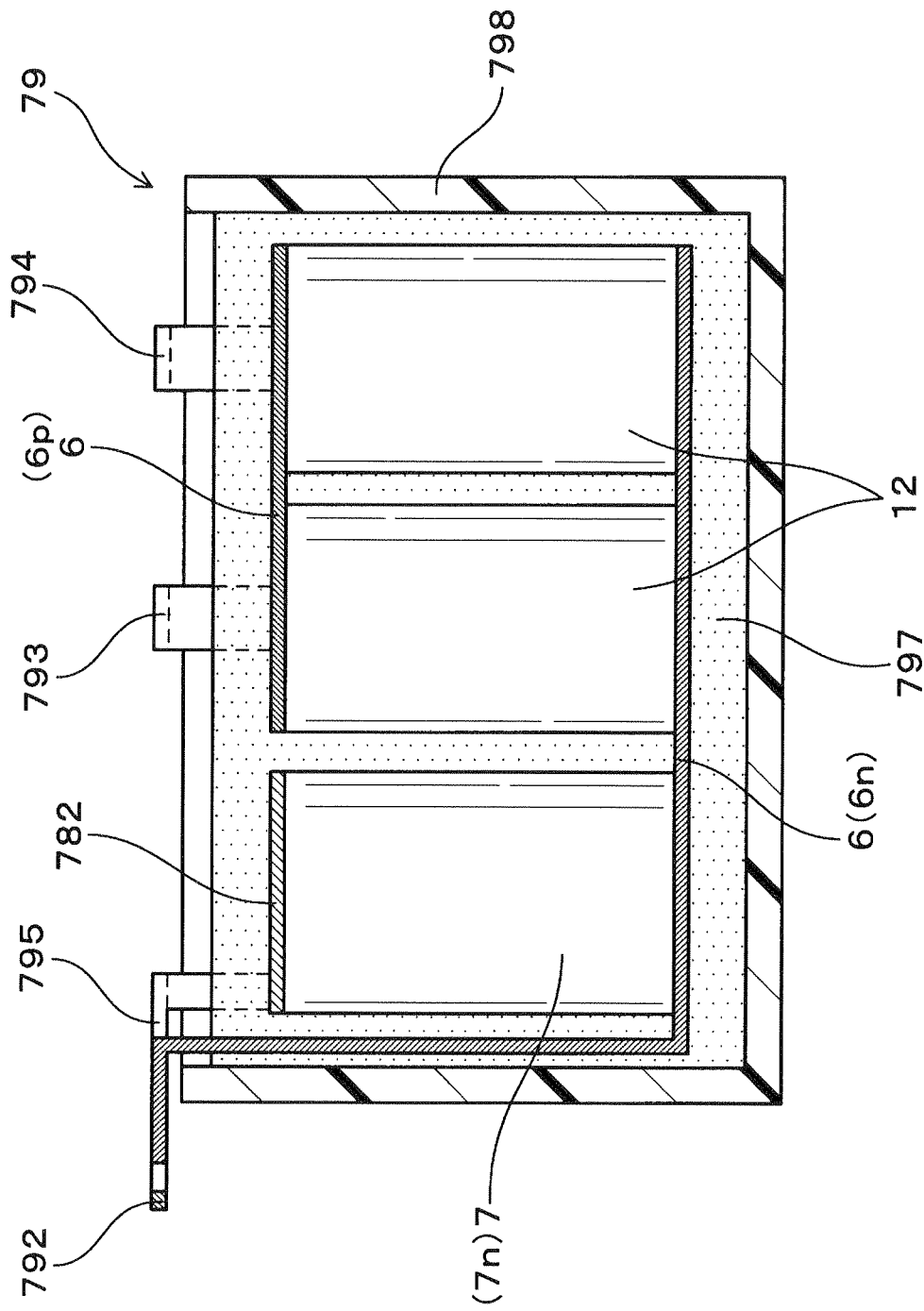
FIG. 20 shows a sectional view taken along a line XX-XX of FIG. 18.

As shown in FIG. 19, the positive side distal bypass to capacitor 7p and the filter capacitor 12 are connected together by the positive bus bar 6p. Further, as shown in FIG. 20, the negative distal bypass capacitor 7n and the filter capacitors 12 are connected together by the negative bus bar 6n. The input terminal 791 and the output terminal 793 of the positive side are extended from the positive bus bar 6p. Further, the input terminal 792 and the output terminal 794 of the negative side are extended from the negative bus bar 6n.

As shown in FIG. 19, a positive ground electrode plate 781 is connected to the positive distal bypass capacitor 7p on an opposite side to a side where the positive bus bar 6p is connected. The positive ground terminal 795 is extended from the positive ground electrode plate 781. Further, as shown in FIG. 20, a negative ground electrode plate 782 is connected to the negative distal bypass capacitor 7n on an opposite side where the negative bus bar 6n is connected. The negative side ground terminal 796 (refer to FIG. 18) is extended from the negative side ground electrode plate 782.

As shown in FIG. 18, a plurality of fixing portions 799 for fixing the capacitor case 798 to the case 15 of the electric power converter 1 are formed on the capacitor case 798. The positive ground terminal 795 is overlapped on to one of the fixed portions 799a among the plurality of fixed portions 799. Then, the fixed portion 799a and the positive ground terminal 795 are fastened together by using a bolt that is not shown, and are fixed to the case 15. Similarly, the negative ground terminal 796 is fastened together at another fixed portion 799b. According to this configuration, while the capacitor case 799 is fixed to the case 15, the ground terminals 795, 796 are connected to ground.

Functions and effects of the present embodiment are described. In the present embodiment, the distal bypass capacitors 7 are not disposed on the control circuit board 4. Therefore, it is possible to increase the size of the distal bypass capacitor 7 so that it is possible to increase their capacitances. Thus, it is possible to efficiently remove noise current with a low frequency using the distal bypass capacitors 7.

Further, a single capacitor module 79 is constituted by integrating the distal bypass capacitors 7 together with the filter capacitors 12 in the present embodiment. Therefore, it is possible to reduce the number of components, and it is possible to reduce the manufacturing cost of the electric power converter 1.

The eighth embodiment has the same configuration and effects as the first embodiment other than the above.

Although the smoothing capacitor 13 is provided separately from the capacitor module 13 in the present embodiment, the present disclosure is not limited thereto. That is, the smoothing capacitor 13 may become the capacitor module 13 by integrating together with the filter capacitors 12 and the distal bypass capacitors 7. Moreover, the distal bypass capacitor 7 may also be separated from the distal bypass capacitors 7 and the smoothing capacitor 13.

Figure 21:
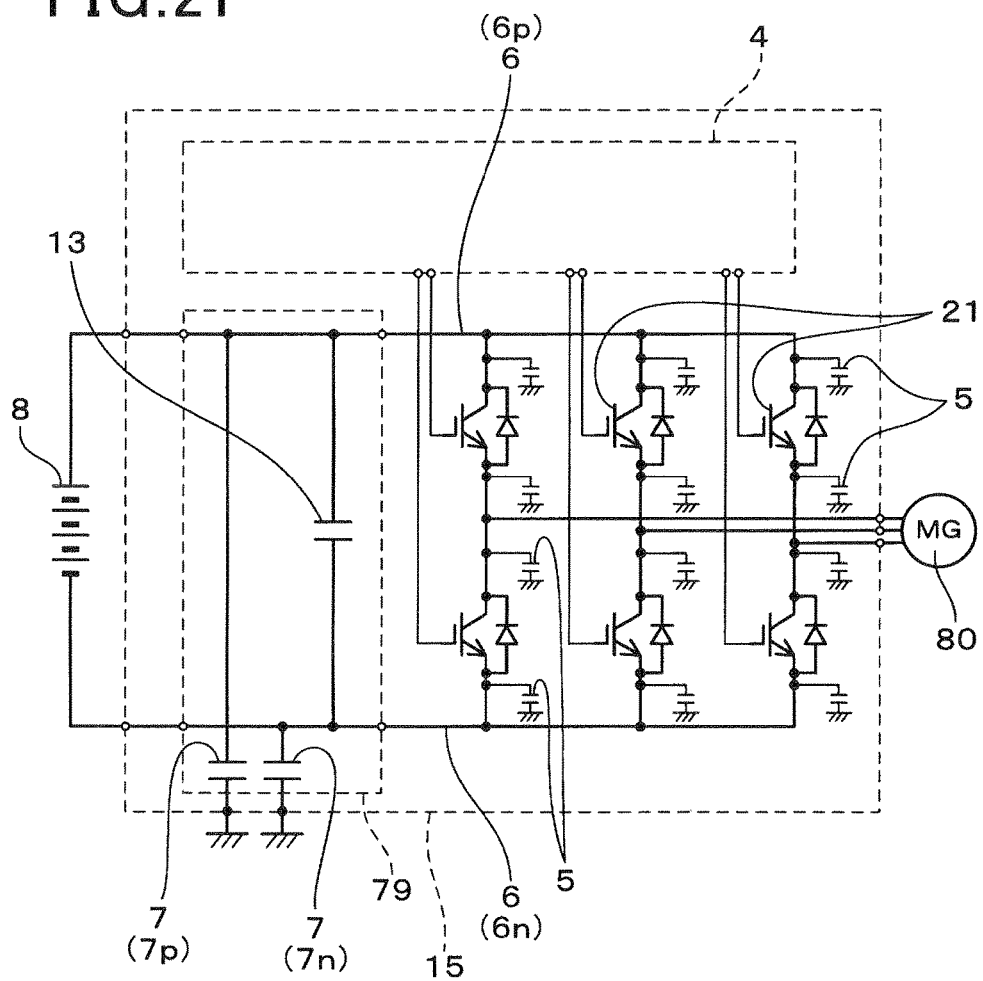
FIG. 21, shows a circuit diagram of the electric power converter in the eighth embodiment without a booster circuit.

Furthermore, although the electric power converter 1 in the present embodiment is provided with the booster circuit 18 as shown in FIG. 17, the present disclosure is not limited thereto but may also be applied to the electric power converter 1 without the booster circuit 18 as shown in FIG. 21.

What is claimed is:

1. An electric power converter comprising:
   a semiconductor module with a built-in switching element;
   a cooler for cooling the semiconductor module;
   a control circuit board for controlling an operation of the switching element; and
   a pair of direct current bus bars connected to the semiconductor module, and serve as current paths between a direct current power supply and the switching element; wherein,
   the cooler is made of metal and electrically connected to ground;
   the semiconductor module has a metal heat radiating plate connected to the switching element, and an insulating layer is interposed between the heat radiating plate and the cooler that insulates them, and a proximal bypass capacitor is formed close to the switching element by the heat radiating plate, the insulating layer, and the cooler;
   there is provided at least a pair of distal bypass capacitors, each of which has a larger capacitance than the proximal bypass capacitor has, connects between each of the direct current bus bar and ground, and has a current path to the switching element of which a length is longer than a current path to the switching element from the proximal bypass capacitor;
   the pair of distal bypass capacitors are disposed on the control circuit board, a potentiometric circuit for measuring a potential difference between the pair of direct current bus bars are formed on the control circuit board, and the potentiometric circuit and each of the distal bypass capacitors is connected by wirings formed on the control circuit board;

the proximal bypass capacitor has a filter function for high frequency components; and the distal bypass capacitors have a filter function for low frequency components.

2. The electric power converter according to claim 1, wherein, the distal bypass capacitor is disposed on the control circuit board, parts of the pair of direct current bus bars are respectively placed on the control circuit board, and the placed parts are respectively connected to the distal bypass capacitors.

3. The electric power converter according to claim 2, wherein, the distal bypass capacitor is mounted on a surface the control circuit board.

4. The electric power converter according to claim 1, wherein, the distal bypass capacitor is mounted on a surface the control circuit board.

* * * * *